US007245074B2

(12) United States Patent
Shiang

(10) Patent No.: US 7,245,074 B2
(45) Date of Patent: Jul. 17, 2007

(54) ORGANIC ELECTROLUMINESCENT DEVICES HAVING IMPROVED LIGHT EXTRACTION

(75) Inventor: Joseph John Shiang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 295 days.

(21) Appl. No.: 10/850,700

(22) Filed: May 24, 2004

(65) Prior Publication Data

US 2005/0018431 A1 Jan. 27, 2005

Related U.S. Application Data

(60) Provisional application No. 60/489,382, filed on Jul. 24, 2003.

(51) Int. Cl.
*H05B 33/00* (2006.01)
(52) U.S. Cl. ........................ 313/504; 313/498
(58) Field of Classification Search ......... 313/504–506
See application file for complete search history.

(56) References Cited

U.S. PATENT DOCUMENTS

| 6,710,541 B2 * | 3/2004 | He et al. ..................... 313/504 |
| 6,809,782 B1 | 10/2004 | Kawamoto et al. |
| 2002/0008807 A1 | 1/2002 | Miyatake et al. |
| 2003/0111955 A1 | 6/2003 | McNulty et al. |

OTHER PUBLICATIONS

I. H. Campbell, D. L. Smith, *Solid State Physics*, 55, 1 (2001) no month.
R. H. Friend et. Al., Nature 397, 121 (1999).
A.R. Duggal, J.J. Shiang, C.M. Heller, D.F.Foust, Appl. Phys. Lett., 80, 3470, (2002) no month.
A. Bergh, G. Craford, A. Duggal, and R. Haitz, Physics Today 54, 42 (Dec. 2001) no month.
I. J. Shiang, T.F. Faircioth, A. R. Duggal, J. Appl. Phys., 95, 5, 2889 (2004) no month.
J.S. Kim, P. K. H. Ho, N. C. Greenham, R. H. Friend, J. Appi. Phys. ,88 ,1073 (2000) no month.
M. H. Lu, J.C. Sturm, J. Appi. Phys., 91, 595, (2002) no month.
W N Carr, Infrared Physics, 6, 1, (1966) no month.
V. Bulovic, V.B Khalifin, G. Gu, P.E. Burrows, D.Z. Garbuzov, and S.R. Forrest, Phys., Rev. B., 58, 3730, (1998) no month.
G Gu, D. Z. Garbuzov, P.E. Burrows, S. Venkatesh, S. R. Forrest, M. E. Thompson, Optics Letters, 22, 396, (1997) no month.
T. Tsutsui, N. Takada, S. Saito, E. Ogino, Appl. Phys. Lett., 65, 1868, (1994)no month.
H. Benisty, H. De Neve, C. Weisbuch, IEEE J. of Quantum Electron., 34, 1612, (1998) no month.

(Continued)

*Primary Examiner*—Joseph Willaims
(74) *Attorney, Agent, or Firm*—Mary Louise Gioeni; William E. Powell, II

(57) ABSTRACT

Organic electroluminescent devices having improved light extraction include a light-scattering medium disposed adjacent thereto. The light-scattering medium has a light scattering anisotropy parameter g in the range from greater than zero to about 0.99, and a scatterance parameter S less than about 0.22 or greater than about 3.

8 Claims, 12 Drawing Sheets

OTHER PUBLICATIONS

T Tsutsui, M. Yahiro, H. Yokogawa, K. Kawano, M. Yokoyama, Adv. Mat., 13, 1149, (2001) no month.

R. Windish, P. Heremans, A. Knobloch, P. Kiesel, G.H. Dobler, B. Dutta, O. Borghs,, Appl. Phys. Lett, 74, 2256, (1996) no month.

H.I. Schnitzer, E. Yablonovitch, C. Caneau, T. J. Gmitter, and A. Scherer, Appl. Phys. Lett. 63, 2174, (1993) no month.

C.F. Madigan, M. H. Liu, J.C. Sturm, Appl. Phys. Lett, , 76, 1650, (2000) no month.

S Moller, S. F. Forrest, J. of Applied Physics., 91, 3324, (2002) no month.

M. Boroditsky, T.F. Krauss, R. Coccioli, V. Vrijen, R. Bhat, B. Yablonovivh, Appl. Phys. Lett., 75, 1036, (1999) no month.

T. Yamasaki, K. Sumioka, T. Tsutsui, Appl. Phys. Lett, 76, 1243, (2000) no month.

H.C. Van de Hulst, Light Scattering by Small Particles, p. 128, John Wiley & Sons, Dover, New York, pp. 114-130 (1957) no month.

T. F. Soules, W. A. Klatt, J. Illum. Eng. Soc., 17, 92, (1988) no month.

Y.X. Hu, B. Wielicki, B. Lin, G. Gibson, S.C. Tsay, K, Stamnes, T. Wong, J. Quant., Spect. Rad. Trans, 65, 681, (2000) no month.

L.G. Henyey, J. L. Greenstein, Astrophys. J., 93,76, (1941) no month.

P.M. Saulnier, M. P. Zinkin, G. H. Watson, "Scatterer Correlation Effects on Photon Transport in Dense Random Media", Physical Review B, vol. 42, 2621 (1990) no month.

W.M. Cornette, J.G. Shanks, Applied Optics, 31, 3152, (1992) no month.

P.S. Mudgett, L.W. Richards, Appl. Optics, 10, 1485, (1971) no month.

K. Stamnes, S.C. Tsay, W. Wiscombe, K. Jayaweera, Appl. Optics, 27, 2502, (1986) no month.

J. Gruner, F. Cacialli, R. H. Friend, J. Appl. Phys. 80, 207, (1996) no month.

O. H. Crawford, J. Chem. Phys., 89, 6017, (1988) no month.

W. W. Beers, H. A. Comanzo, & A. M. Srivastava, "Development of phosphors for ultraviolet LEDs," from Physics and Chemistry of Luminescent Materials, edited by C. R. Ronda, L.E. Shea, and A.M. Srivastava, ECS Proceedings vol. 99-40, p. 106 (2000) no month.

* cited by examiner

Device

Model

Fig. 15
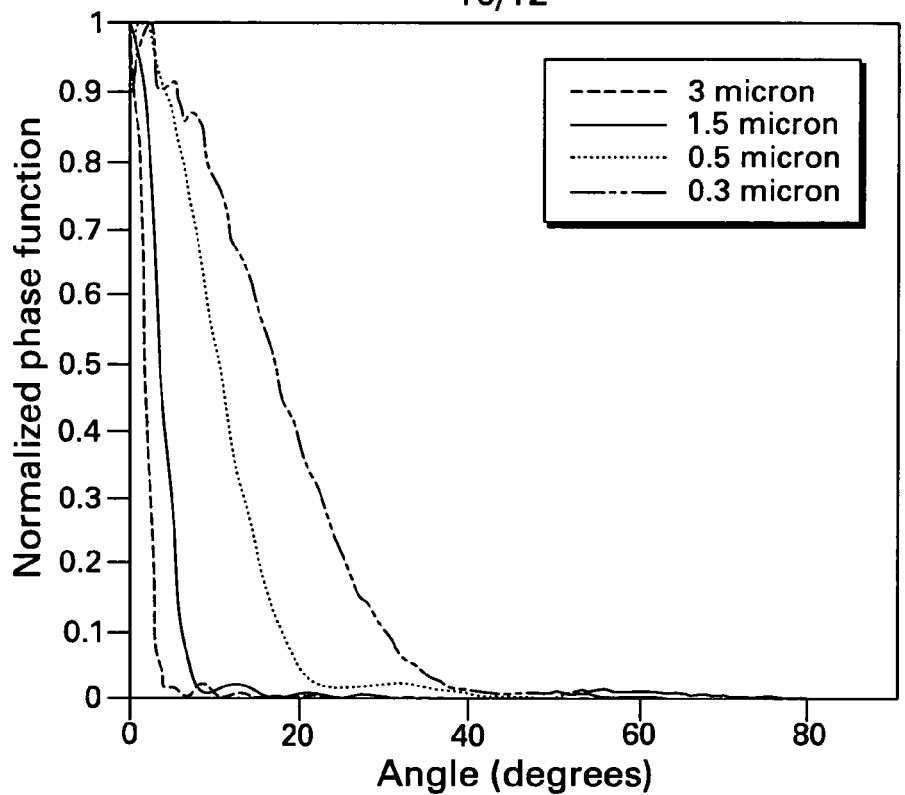
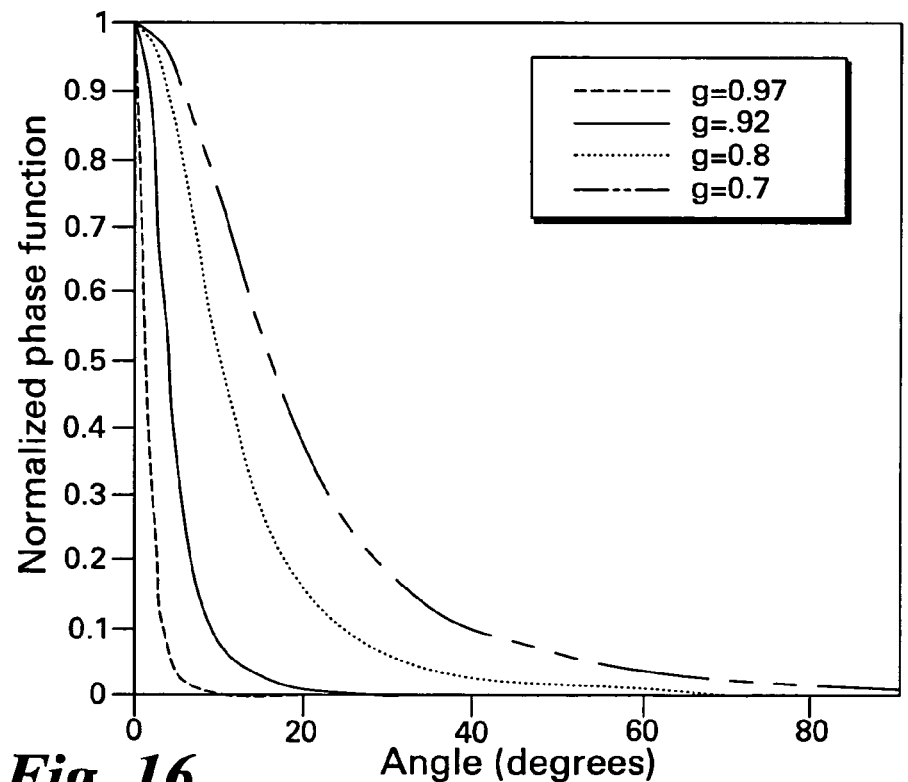
Fig. 16

*Fig. 17*
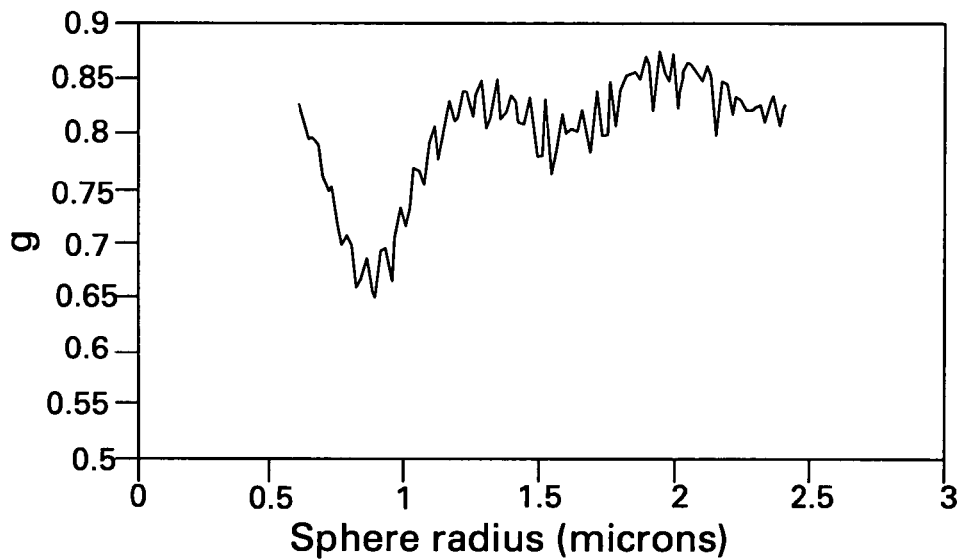
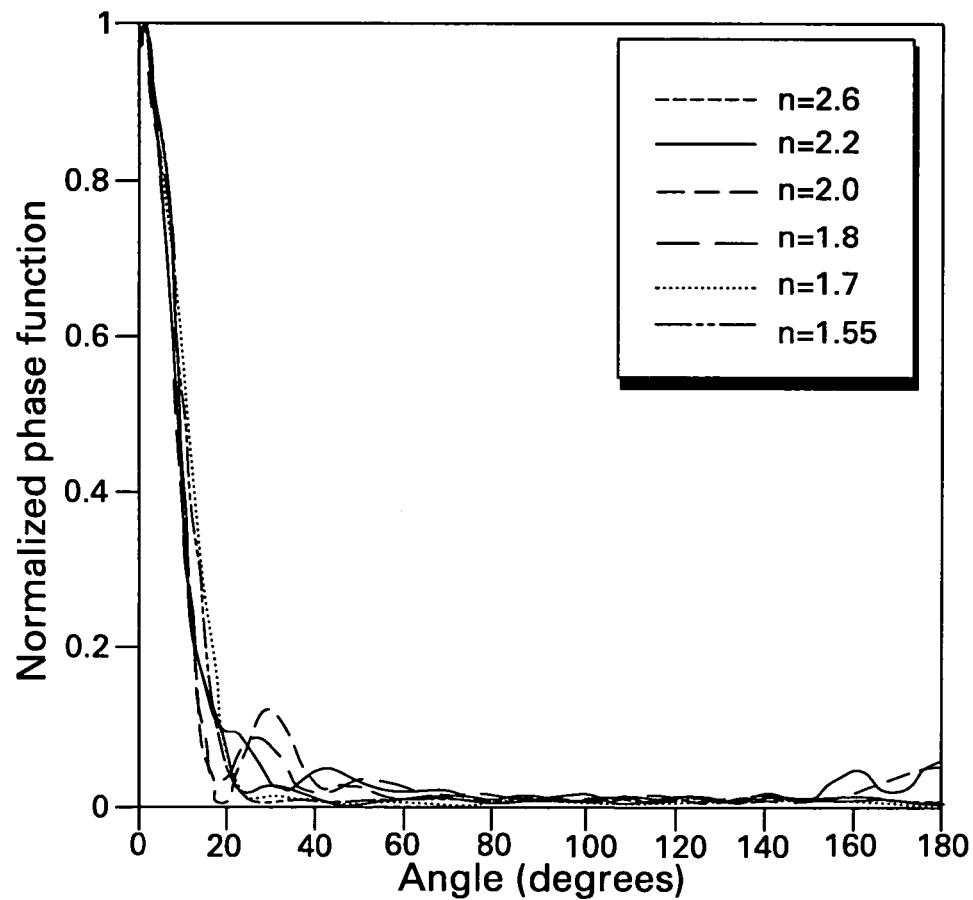
*Fig. 18*

ORGANIC ELECTROLUMINESCENT DEVICES HAVING IMPROVED LIGHT EXTRACTION

This application claims the benefit of U.S. Provisional Application No. 60/489,382, filed Jul. 24, 2003, the disclosure of which is hereby incorporated by reference in its entirety.

This invention was first conceived or reduced to practice in the performance of work under contracted-FC26-00NT40989 awarded by the United States Department of Energy. The United States of America may have certain rights to this invention.

BACKGROUND OF THE INVENTION

The present invention relates generally to light-emitting devices having organic electroluminescent material. In particular, the present invention relates to designs and methods for enhancing light extraction from such devices.

In the present disclosure, the terms "organic electroluminescent device" and "organic light emitting diode" are used interchangeably.

In the last decade, tremendous strides have been made in the science and technology of organic light emitting diodes (OLEDs). Most of this progress has been fueled by interest in developing flat panel displays, however, if the rate of progress can be sustained into the next decade, OLED technology has the potential to impact general lighting applications. In particular, a large area white-light emitting OLED could potentially provide a solid state diffuse light source competitive with conventional lighting technologies in performance and cost. Achieving this will require significant advances in efficiency, life at high brightness, and the illumination quality of OLED-generated light.

One of the limitations on organic light emitting diode (OLED) performance is the optical extraction efficiency, $\eta_{ex}$ which is the ratio of light generated within the device to light emitted into the ambient. Typical estimates for this efficiency factor in OLEDs range between 0.17-0.5.

Recently, a promising down-conversion method for achieving illumination-quality white light utilizing an underlying blue OLED was demonstrated. It was found that the presence of an inorganic phosphor layer actually enhanced the power efficiency of the underlying blue OLED and this was attributed to the presence of volume light scattering within the phosphor layer. In this paper, we develop an analytical model to understand the influence of volume scattering on OLED light output and use this to develop design guidelines to maximize device efficiency. In particular, we explore how the amount of light extracted from the OLED depends upon such factors as the particle size, loading fraction and optical loss in the system. In a companion paper, we describe detailed experimental measurements that prove the quantitative validity of this model.

BRIEF SUMMARY OF THE INVENTION

In one aspect of the present invention, we utilized a radiative transport methodology to develop a simple light extraction model for an OLED coupled with volumetric scattering. The model demonstrates that simple volumetric light scattering can enhance light output. Calculations were performed as a function of OLED and scattering parameters in order to develop design guidelines for efficiency enhancement. The calculations suggest that it is relatively simple to use volume scattering to increase the light output by a factor of 2 and provide direction for future light extraction improvements. It should be noted that it is relatively straightforward to adapt this model to other more complex systems such as textured surfaces, phosphor-OLED systems, LED-phosphor and light propagation in x-ray scintillators. Results of the model were confirmed with experimental data obtained for scattering systems.

In another aspect of the present invention, we demonstrate that it is possible to obtain a quantitative measurement and prediction of the increase in light output due to volumetric light scattering, and we demonstrate a clear increase in the observed extraction efficiency. We find that for an OLED on a glass substrate the fraction of light that crosses the substrate-air interface increases to almost 0.75. Using ray-tracing, we are able to account for the differences between the analytical infinite plane model and the observed results, we require no additional parameters to model our data. The high level of agreement between the model and experimental data serves to validate the use of simple radiative transport models to predict OLED efficiencies and optimization strategies. Having validated our radiative transport model, we may extend it to encompass existing microcavity models, and phosphorescent or fluorescent particles as well as providing a uniform description and quantitative assessment of many different enhancement schemes that have appeared in the literature.

In one embodiment of the present invention, a light source comprises:

(a) a light-emitting device; and (b) a light-scattering medium optically coupled to the light-emitting device, wherein the light scattering medium has a light scattering anisotropy (denoted by the parameter "g" and defined below) in a range from about 0 to about 0.99, and a scatterance (denoted by "S" and defined below) in a range selected from the group consisting of $0<S \leq 0.22$ and $S>3$.

In another aspect of the present invention, the light-emitting device is an organic electroluminescent device, and the light scattering medium comprises scattering particles in a host matrix.

In another aspect of the present invention, the organic electroluminescent device is an organic light-emitting diode ("OLED").

Other features and advantages of the present invention will be apparent from a perusal of the following detailed description of the invention and the accompanying drawings in which the same numerals refer to like elements.

BRIEF DESCRIPTION OF THE DRAWINGS

FIG. 15: Normalized phase function calculated using the Mie theory spherical non-absorbing particles with different radii FIG. 16: Calculated phase function using the Henyey-Greenstein function for different values of the asymmetry parameter g.

FIG. 17: Plot of g as a function of sphere size. The index of the medium is 1.41, the index of the spheres is 1.85 and the wavelength of the incident light is 632 nm FIG. 18: Normalized phase function for different values of the optical index (legend). The index of the surrounding medium was 1.5 and the particle radius was set to 0.5 microns.

Other features and advantages of the present invention will be apparent from a perusal of the following detailed description of the invention and the accompanying drawings in which the same numerals refer to like elements.

DETAILED DESCRIPTION OF THE INVENTION

A. Model Development

Figure 1A:
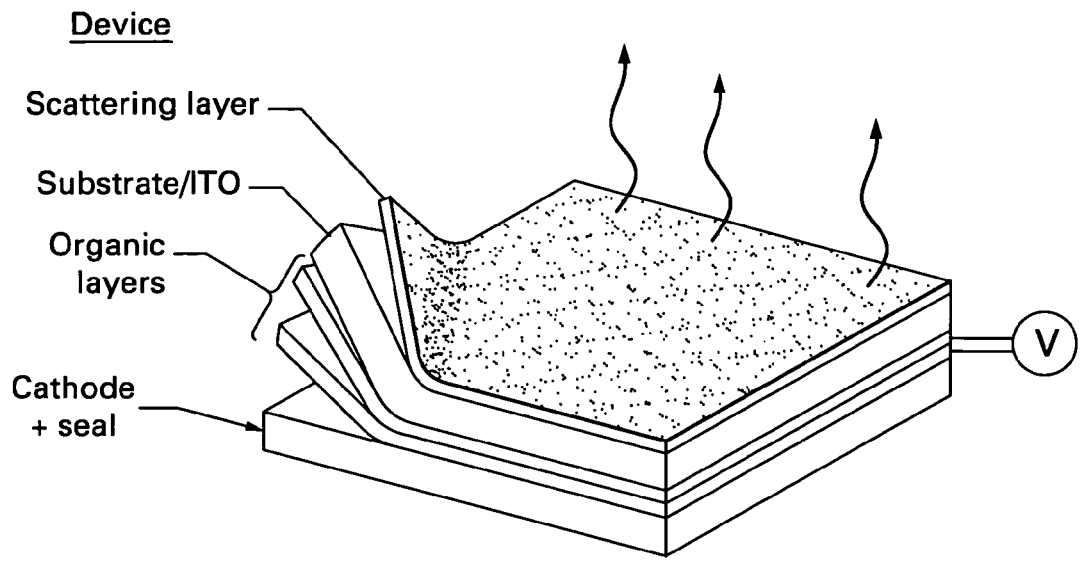
FIG. 1: Schematic illustration of an OLED device (top) and the idealized model geometry and model input parameters (bottom).

Electroluminescent devices are limited by the optical extraction efficiency, $\eta_{ex}$, the ratio of light generated within the device to light emitted into the ambient. For OLEDs, typical estimates for this efficiency range between 0.17-0.5. Thus, a significant fraction of the electrically generated light is lost within the device. This is in sharp relief to the case of mercury vapor fluorescent lighting where the extraction efficiency is close to unity. The origin of this loss mechanism is the fact that light incident at angles above the critical angle of a substrate-air interface undergoes total internal reflection and is never emitted into the ambient.

For an OLED, the optical extraction efficiency can be divided into two components: the injection efficiency from the active layers into the substrate $\eta_{OLED-s}$, and the extraction efficiency from the substrate to the ambient $\eta_{s-a}$; i.e.

$$\eta_{ex} = \eta_{OLED-s} \eta_{s-a} \quad (1)$$

In this disclosure, we focus primarily on the latter term, and in particular we examine the effects of volumetric light scattering upon the fraction of light emitted into the ambient, $\eta_{s-a}$. Our discussion will begin with a brief review of the existing approaches to increasing the light output from OLED devices, and some of the peculiarities of the typical OLED geometry that influence the choice of these approaches. This review is not intended to be complete, but rather to frame our discussion of volumetric light scattering.

A number of solutions have been proposed to improve the light extraction, and hence electrical to optical conversion efficiency, from electroluminescent devices. One solution, most applicable to point sources, is to use a shaped substrate, and it was demonstrated that certain lens like shapes will result in almost complete light extraction. This method has been applied to patterned OLED devices as well, where the active area of the OLED was placed at the center of a large hemisphere or at the bottom of an etched cone. An alternative approach is to modify the angular dependence of the emission profile of the light emitting source so that most of it is not internally reflected. This control of the angular emission is achieved by placing the emitting layer within an optical microcavity designed to ensure that light is emitted in the forward direction at angles below the critical angle of the interface. A variant of this solution is to place a very low index aerogel (n~1.01) next to the thin cavity. If care is taken to ensure that the internal models of the cavity are suppressed then most of the light is coupled into the aerogel layer and ultimately into the ambient due to the small aerogel-air index mismatch. Finally, random or structured surface modification of the top output surface of the device can be used to increase the total light output. Here, light scattering at the top surface of the device combined with a reflective bottom surface can result in a net increase in the fraction of light incident at the top surface at angles below the critical escape angle. A photonic surface texture with feature sizes of the order of the wavelength of light, has also been shown to increase light output from OLEDs however, this approach is more difficult to fabricate.

In this disclosure, we focus on modeling the effect of volumetric scattering on the total light output from an OLED device. In principle, volumetric scattering should accrue the same benefits as surface random surface texturing, but with a very fine level of control. The volume loading of particulate scatterers controls the total amount of scattering, while the average angular deviation induced by each scattering event is controlled through the control of particle shape or size. Operationally, volumetric light scattering may be readily introduced through the application of a scattering medium atop an existing OLED device. This disclosure is organized as follows: in the next section we present a detailed development of a volumetric scattering model appropriate for OLEDs. In our application of the radiative transport theory, every attempt was made to limit the number of input parameters and to ensure that these parameters were amenable to experimental determination. In the third section key results from the numerical model of relevance to OLED design are presented. Numerical details of the model implementation are supplied in the appendix.

We develop a simple radiative transport model that quantifies the effect of volumetric light scattering on light output in organic light emitting devices (OLEDs) in terms of a small set of readily measured parameters. The methodology is sufficiently general to parameterize and describe many of the light extraction schemes found in the literature. A set of model calculations is presented using parameters typical of many OLEDs. These show that the introduction of light scattering sites within the otherwise transparent substrate can increase light extraction efficiencies to values between 0.55 and 1.

1. Theory

In order to develop an analytical approach that can quantitatively describe the effect of volume scattering on the output of an OLED, we employ a radiative transport model. Such models have been developed extensively to describe scattering in different contexts and we will take advantage of the extensive work in this topic. In the theoretical development that follows, we first define the OLED and scattering geometry that will be modeled, then review and utilize the relevant results from single particle scattering theory and the radiative transport approach to multiple scattering to build a model for an OLED which incorporates volume scattering. A method for applying this model to calculate the outcoupling efficiency of an OLED in terms of experimentally accessible parameters is then described. We conclude this section with an enumeration of the different approximations that are used in our description of light scattering in OLEDs.

2. OLED and Scattering Geometry

Figure 1B:
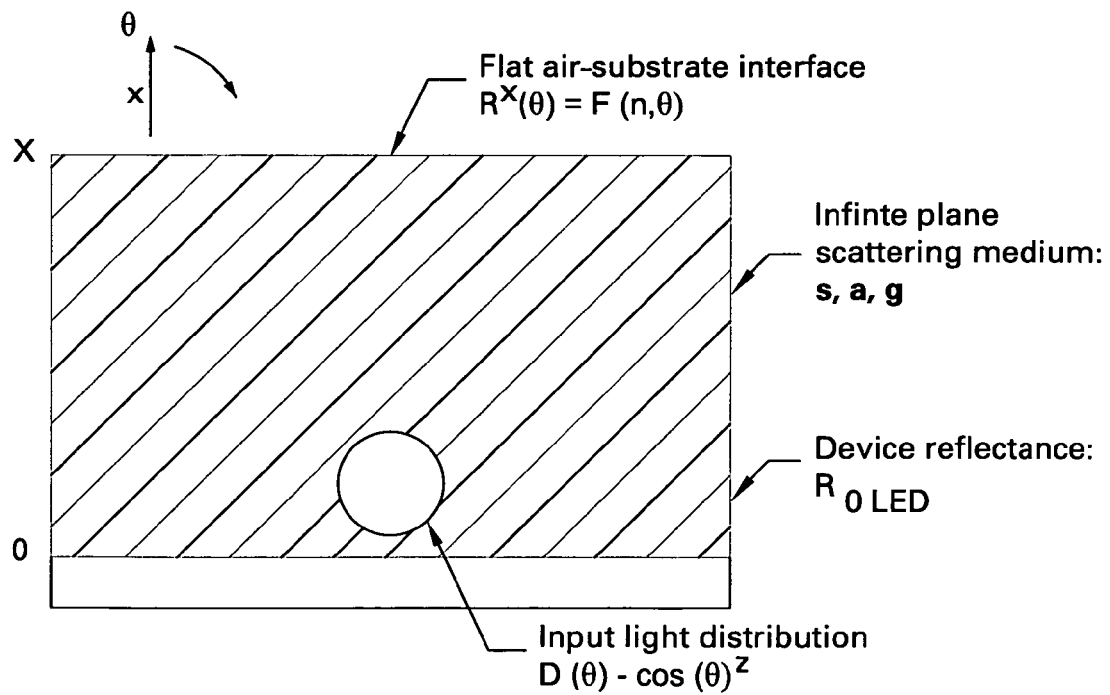

An actual OLED device consists of several layers, each of which serves a specific function. In a standard OLED device (FIG. 1, top) the bottom most layer seals the device from attack by the ambient. Next is a series of layers, the reflective electrode, organic and transparent electrode layers that form the light-emitting structure. Finally, the device is fabricated on a transparent substrate, through which the electrically generated light is coupled into the ambient. To this standard design, we add a layer between the substrate and the ambient consisting of high refractive index scattering particles embedded within a lower refractive index matrix material. Our goal is to understand the effect of this volume scattering layer on light extraction from the OLED. In order to model this structure, we approximate the actual, finite, multilayer OLED geometry with a single layer, infinite plane geometry (FIG. 1, bottom). In this approximate geometry, the light output can be completely described by 7 parameters, which are shown in bold in the figure. The electrically active layers (cathode, organic, anode) form one boundary of the layer, and their properties determine the reflectance at the bottom interface (at x=0) and the angular profile of the input light distribution flux within the substrate, $D(\theta)$. For simplicity, the index of refraction of the matrix material of the volume scattering layer and that of the substrate are assumed to be the same. This allows them to be treated as a single effective scattering layer characterized by the scattering and absorption properties of the layer, which we characterize using three parameters, s, a, and g; the optical index n of the substrate, and physical thickness, X. In the body of the text we will discuss each of these parameters. The top boundary condition (at x=X), for a flat air-substrate interface, is determined by the Fresnel equation for a medium of optical index n.

3. Single Particle Scattering

The physics of individual scattering events is well understood, and for certain shapes, such as spheres, can be derived exactly using Mie theory. From single particle light scattering calculations, there are three quantities of interest: the scattering cross-section, the absorptive loss and the phase function. In a macroscopic sample, the first two quantities are joined with the particle concentration to give a mean free path for scattering, s, and a mean free path for absorption k. The phase function is the relative intensity I' of a scattered wave at angle $(\psi',\phi')$ with polarization $\pi'$, given an incident wave of intensity I at angle $(\psi,\phi)$, with polarization $\pi$, i.e:

$$I_{\pi'}' = p(\psi,\phi,\pi,\psi',\phi',\pi')I_\pi \qquad (2)$$

We write the phase function as $p(\psi,\phi,\pi,\psi',\phi',\pi')$. In our modeling we will introduce several simplifications. We will ignore polarization effects and thus remove any dependence upon $\pi$ or $\pi'$. We will also model each scattering event as azimuthally symmetric and thus removing the dependence upon $\phi,\phi'$. These assumptions amount to assuming that the scattering particles are roughly spherical with randomly oriented facets. This description has been previously used to model phosphor coatings in fluorescent lamps. The remaining angular dependence is only in the difference between the input and output angles, thus we may write the phase function in terms of a single angular variable $\alpha=\psi-\psi'$. It is often helpful to express this simplified phase function in terms of the Legendre polynomials $P_l$:

$$p(\cos(\alpha)) = \sum_{l=0}^{\infty} a_l P_l((\cos(\alpha))) \approx \sum_{l=0}^{L} a_l P_l((\cos(\alpha))) \qquad (3)$$

We truncate the infinite series at some finite value of L, which can be set very high (i.e. >50). In principle, the truncation of the series after a finite L sets a limit on the angular resolution of the model, however, we are always able to find a value of L sufficiently high that so as not to affect the numerical results of interest. If we set $a_0=1$, then the phase function will be normalized so that:

$$4\pi = \int p(\cos(\alpha))d\omega \tag{4}$$

where the integration is over all solid angles.

While the calculation of the phase function for simple shapes is readily done, the exact calculation of the angular dependence of light scattering from most non-simple particle geometries poses considerable numerical difficulties. To model the broad size distribution of irregularly shaped particles that is encountered in a typical scattering particle system, we choose a simple form, known as the Henyey-Greenstein (H-G) phase function. This phase function is widely used, and is readily expanded in terms of Legendre polynomials. The expansion terms for the finite series are:

$$\alpha_l = g^l(2l+1) \tag{5}$$

where g is the asymmetry of the phase function and is given by the expectation value of $\cos(\psi)$:

$$g = \int p(\cos(\psi))\cos(\psi)d\Omega / \int p(\cos(\psi))d\psi \tag{6}$$

Thus the detailed physics of light scattering from irregularly shaped particles is replaced by a single parameter that ranges from −1 to 1. A value of g=1 implies that the scattered radiation is not deviated from its original trajectory, whereas a value of g=−1 implies that it is directly backscattered. The value of this parameter may be experimentally determined. A simple expression that relates g in the H-G model to physical observable is:

$$g = \frac{Q_{ext} - Q_{pr}}{Q_{sca}} \tag{7}$$

where the efficiency factors for radiation pressure $Q_{pr}$, extinction $Q_{ex}$, and scattering $Q_{sca}$ are computed from a physical theory, e.g. Mie model. For example, a spherical scattering particle with an index of refraction of 1.85, embedded in a medium of index 1.41, and having radius of 2 μm, has a value for g ~0.8-0.85. Averaging over spherical resonances, this g tends to increase very slowly as the size is increased. The typical size of commonly available phosphor and scattering pigments ranges from 0.1 to 30 μm; and thus, one expects to find similar values for g in many binder/particle systems. A known problem with the H-G phase function is that it leads to non-physical results for very small (relative to the wavelength of light) particles and for these systems use of the Mie theory or alternative parameterization schemes would be preferred.

4. Radiative Transport Approach to Multiple Scattering

Given a form for the phase function, we need to connect the physics of each scattering event, which can be described exactly or via approximation, to the macroscopic observables and boundary conditions in a turbid media where a single incident photon has undergone several scattering events before leaving the medium. This is the radiative transfer problem and its elucidation in scattering media has been a problem of considerable interest in a number of fields and, in particular, astronomy. For an infinite plane-parallel scattering medium, this equation is:

$$-\mu \frac{dI(x,\mu,\varphi)}{dx} = (k+s)I(x,\mu,\varphi) - \frac{s}{4\pi}\int_0^{2\pi}\int_{-1}^{1} p(\mu,\varphi,\mu',\varphi')I(x,\mu',\varphi')d\varphi'd\mu' \tag{8}$$

where $I(x,\mu,\phi)$ is the intensity as a function of position and angle. The variables k and s correspond to the mean free path between absorption and scattering events respectively. We have made the standard substitution $\mu=\cos(\theta)$ and it should be noted that the angles $\theta$, and $\phi$ are in the laboratory frame. We connect these laboratory frame angles with relative angle in the particle frame, $\alpha$, by using the Legendre angle addition theorem:

$$P_l(\cos(\alpha)) = P_l(\mu)P_l(\mu') + 2\sum_{m=1}^{l}\frac{(l-m)!}{(l+m)!}P_l^m(\mu)P_l^m(\mu')\cos(m(\varphi'-\varphi)) \tag{9}$$

Since we will avoid deviating from azimuthal symmetry in either the boundary or the initial conditions, we are able to perform the integral over $\phi'$ to find:

$$-\mu\frac{dI(x,\mu)}{dx} = (k+s)I(x,\mu) - \frac{s}{2}\int_{-1}^{1}\sum_l a_l P_l(\mu)P_l(\mu')I(x,\mu')d\mu' \tag{10}$$

Several of the different methods that have been developed to solve this problem are summarized in H. C. Van de Hulst, "Multiple Light Scattering," Academic Press, New York (1980). We use the discrete ordinate (DO) approximation which is well described in the literature (See; e.g., S. Chandrasekhar, "Radiative Transfer," Dover, N.Y. (1960); P. S. Mudgett et al., Appl. Optics, Vol. 10, 1485 (1971); K. Stamnes et al., Appl. Optics, Vol. 27, 2502 (1986)). We summarize the approximation here; the details of our implementation are described in Appendix A.

Within the discrete ordinate approximation, the angle coordinate is discretized, into a set of N channels, each with index i, and the integral is replaced by a sum:

$$-\langle\mu_i\rangle\frac{dI_i(x)}{dx} = (k+s)I_i(x) - \sum_j^N \frac{\omega_j s}{4\pi}\sum_{l=0}^L a_l P_l(\mu_i)P_l(\mu_j)I_j(x) \tag{11}$$

where $\langle\mu_i\rangle$ is the average value of $\mu$ in each channel and the additional factor $\omega_i/2\pi$ arises from normalizing the area of each channel. It is more convenient to work in terms of flux rather than intensity. The flux in each channel i is related to the intensity by:

$$F_i = \int_{\theta_{i-1}}^{\theta_i} I(\theta,\varphi)\cos(\theta)\frac{d\omega}{2\pi} \approx \langle\mu_i\rangle I_i \tag{12}$$

where $F_i$ is the rate of energy flow in a pencil of radiation in an element of solid angle $d\omega_i$, passing through an element of area $d\omega$ parallel to the boundaries. The equation for the flux as it propagates through the medium now reads:

$$-\frac{dF_i(x)}{dx} = \frac{(k+s)}{\langle\mu_i\rangle}F_i(x) - \sum_j^N \frac{\omega_j s}{4\pi\langle\mu_j\rangle}\sum_{l=0}^L a_l P_l(\mu_i)P_l(\mu_j)F_j(x) \quad (13)$$

If we then substitute our approximation for the phase function (eq. 4) we arrive at the following coupled set of linear differential equations.

$$-\frac{dF_i(x)}{dx} = \frac{(k+s)}{\langle\mu_i\rangle}F_i(x) - \sum_j^N \frac{\omega_j s}{4\pi\langle\mu_j\rangle}\sum_{l=0}^L g^l(2l+1)P_l(\mu_i)P_l(\mu_j)F_j(x) \quad (14)$$

The advantage of this approach is the reformulation of the general integro-differential radiative transfer equation (eq. 7) into this simpler set of coupled equations. The numerical accuracy and angular resolution of the numerical model depends upon the number of channels used. We find that for the relatively low accuracy we need for our total flux calculations (~1%), between 25 and 60 channels is more than sufficient and leads to matrices whose eigenvalues are readily determined by conventional numerical packages in a sufficiently stable manner.

The boundary conditions are the bi-directional reflectance at x=0 and x=X, where X is the thickness of the scattering medium. We denote these quantities as $R^0(\theta,\theta')$ and $R^X(\theta,\theta')$. These conditions are quite general and can describe either scattering or non-scattering interfaces. We shall make the following simplifications: the boundaries are flat, only specular reflection occurs. Furthermore, the reflectivity of the boundary at x=0 is angle independent, and thus described by a single effective cathode reflectivity $R_{OLED}$. The reflectance at the top boundary, $R^X$, is given by the Fresnel equation and is completely characterized by the substrate index n. Within the DO model these boundary conditions are described by matrices $R^0_{i,j}$ and $R_{Xi,j}$; expressions for these quantities are described in the appendix. In this notation, the diagonal elements $R^0_{i,j}$, $R^X_{i,j}$ represent the fraction of the flux that is transmitted through or into the boundary layer.

We are also able to introduce a further simplification that arises from our use of an infinite plane geometry. Formally, the layer thickness, X, is also a required input parameter, however, since the transfer equation depends linearly upon the values of s and k, we can rescale the problem to eliminate the variable X. We do this by substituting defining a new variable x'=x/X, and define the total scatterance S=s·X and total absorbance K=k·X. We then substitute the values of x', S, K for x, s and k in Eqn. 14, and set the top boundary at X'=1.

5. Calculation of OLED Outcoupling Efficiency

The input light is assumed to enter the medium at the point x=0, and the initial condition is the angular distribution of the light as it emerges from the active layers of the OLED and enters the substrate, i.e. $I_0(\theta)$. We write this condition in terms of flux, $D(\theta)$, and parameterize it by a single number z:

$$D(\theta) = \cos(\theta)^z \quad (15)$$

when discretized this condition can be written $D_i = \langle\mu_i\rangle^z$. The Lambertian like emission pattern that is commonly observed corresponds to a value of z=1. Higher values of z correspond to a more highly forward directed emission. Such emission patterns are possible if optical microcavity structures are built into the OLED device design. Due to the underlying linearity of the system of equations, this treatment of the initial conditions is quite general, as a given experimental or theoretical angular emission pattern may be represented by a series of orthogonal polynomials in μ. Thus, for a given set of scattering and boundary conditions, we can compute the output coupling for each value of z, fit the angular emission profile to a polynomial expansion and take the appropriate weighted sum.

Given the initial and boundary conditions we solve Eqn. 14 to find the amount of flux F that 'leaks' from each angular channel to the ambient.

$$F_i^{out} = (R_{i,i}^X)F_i(X) \quad (16)$$

where $R_{ii}^X$ is equal to the transmittance across the interface for each angular channel i, for planar interfaces it is determined by the Fresnel equation. The fraction of light outcoupled from the substrate to the air can be expressed as:

$$\eta_{s-a} = \frac{\sum F_i^{out}}{\sum D_i} \quad (17)$$

Note that, in the absence of scattering, $F_i(X) = D_i$, and we recover the usual result that the light output is determined by the optical index and the shape of the input light distribution. In this case the substrate to air coupling efficiency is well approximated by:

$$\eta_{s-a} = \int_0^{\theta_c} D(\theta)\sin(\theta)d\theta \quad (18)$$

where $\theta_c = \operatorname{asin}(1/n)$, the critical angle. If one combines this result for $\eta_{s-a}$ with an appropriate microcavity model for $\eta_{oled-s}$ in Equation 1, one recovers the usual estimates for the total out-coupling efficiency $\eta_{ex}$.

6. Summary of Approximations

In the course of our analysis, we have made several approximations that may be grouped into eight categories. We have assumed that: 1) The scattering layer and OLED substrate can be modeled as an infinite homogeneous, isotropic layers; 2) scattering events and the radiation source possess azimuthal symmetry; 3) polarization effects are relatively unimportant; 4) a single approximate phase function models single scattering events over all wavelengths, and there is no interference between scattering events; 5) We can use an average effective cathode reflectivity that is independent of angle and position; 6) the top surface is flat; 7) we can ignore fluorescence effects. The eighth category results from errors introduced by our particular choice of numerical solution, these are discussed extensively in the appendix and in the literature; they will not be addressed further here.

The first set of approximations, which maps the problem to the realm of atmospheric physics, is probably the most significant. Clearly, an infinite layer approximation is suspect if the OLED is on a very small substrate where emission from the sides is a significant fraction of the total emitted light. However, for applications such as lighting, there is a trend towards using thinner, larger area OLEDs with a high device fill factor where the amount of light emitted from the sides of the substrate is small. In these cases, the infinite layer approximation is acceptable. For the thin, transparent substrates typical for OLEDs, the medium is well modeled by single layer. However, if required, this assumption is readily relaxed by treating the system as a succession of homogenous layers, which amounts to using the model separately on each layer. The requirement that each layer be homogeneous is equivalent to assuming that one is always interested in behavior with length scales much greater than those of a single particle or average particle separation. Since these distances are usually on the order of microns and the substrates are usually on the order of millimeters in thickness, this approximation is also well justified.

The remaining approximations simplify the radiative transfer equation significantly. The second approximation is justifiable on an empirical basis; it adequately describes light scattering from many phosphor systems, and the radiation pattern from typical OLED devices although some OLED devices in which the emission pattern or scattering is dominated by grating effects will not be readily described using this approximation. The third approximation leads to the largest errors in the case of small amount of light scattering, and indeed polarization effects are seen in the OLED emission pattern of standard flat substrates. The dominant effect seems to be a change in angular profile; in terms of the model this implies that one polarization is characterized by a different value of z in the expression $D(\theta)=\cos(\theta)^z$. However, as will be shown in section III.2.D, changes in z lead to relatively small effects in the presence of light scattering, and thus in many cases polarization effects can be ignored.

The fourth and fifth approximations group many different physical effects together into single parameters. The fourth approximation groups the details of the physics of single particle light scattering into the parameter g. Given that we are only interested in the total flux emerging from the device, and not any angular details, results from the atmospheric scattering literature suggest that this parameterization should not induce large errors. The fifth approximation groups the reflectance of the metal cathode and thin film OLED layers into a single average number, $R_{OLED}$, which represents the angle and polarization averaged specular reflectance. Calculation of the polarization averaged, angle dependent reflectivity for an idealized aluminum-glass (n=1.5) interface revels that it varies between 0.87 and 0.84 in the range between 0 and 80 degrees. Given this minor variation, our approximation should be adequate. If the cathode is textured in some manner then a non-specular component to the reflectance is required.

The assumption that the top surface is flat may be relaxed, if necessary, through the introduction of non-specular reflection terms in the top boundary condition. There are several top-surface texturing schemes in the literature that are known to improve light output; these may be approximated by non-specular reflection coefficients in the top boundary. The required new inputs in the case are the Bi-Directional Reflectance Function (BDRF) of each surface which can be readily measured. For purposes of the model, any texturing or emission pattern is readily parameterized, provided that the condition of azimuthal symmetry is maintained.

Fluorescent or phosphorescent scattering systems may also be handled quite readily by the inclusion of additional equations that describe the flux in each channel, but at a different wavelength. In practice this works out to doubling the number of channels so that the down-converted wavelength has its own gain and loss terms. Using this extension of the model coupled to a microcavity model of light generation within the OLED would allow for a complete description of the white light device demonstrated in A. R. Duggal et al., Appl. Phys. Lett., Vol. 80, 3470 (2002), which consisted of a blue OLED coupled to a phosphor down-conversion layer to generate white light.

7. Results

In the previous section, we provided a detailed development of a seven-parameter model of radiative transport appropriate for OLED devices. In this section, we discuss some implications of this model for light extraction. The model is sufficiently flexible to describe most large area flat OLEDs and at the same time all of the parameters are accessible through experimental measurement. Experiments were conducted that prove the validity of this model for real OLED systems. In this section, we present a mapping of model parameters to OLED design parameters and discuss the impact of these choices upon light extraction.

8. Relation Between Model Parameters and Device Design Variables

Within the context of the model, the OLED device design sets three parameters—the index of refraction of the substrate (n), the effective reflectivity of the bottom layer R, and the angular distribution of the emitted light as it enters the substrate from the active layers of the OLED, $D(\theta)$, which is characterized by the parameter z. These variables can be directly measured and can be controlled through choices in device design. For example the reflectance parameter includes not only the losses associated with the metal film, but also absorption losses incurred by the transparent electrode and organic layers. The presence of these additional layers limits the reflectance to a lower value than the theoretical maximum, which is dictated by the metal and substrate complex dielectric constants. The impact of multiple layer OLED structures on the angular light distribution is well known, and through the use of multiple layers and narrow ranges of emission wavelengths, the light output can be highly directed, thus altering z. For a typical OLED fabricated on glass with weak microcavity effects, typical values for these three parameters are $R_{OLED}=0.8$, $n=1.5$, $z=1$.

The remaining parameters in the model relate to the volume scattering medium. In general, absorptive losses for scattering systems can be made very low i.e. k<0.001. Thus, in the remainder of the discussion absorption loss in the scattering medium will be ignored. The total scatterance, $S=s\, X$ is controlled by the mean free path between scattering events, s, and the substrate thickness, X. Experimentally, the scatterance may be adjusted through a combination of the scattering particle loading and scattering layer thickness. Thus, the parameter, S, is broadly tunable but for most applications varies in the range 0 to 6. The asymmetry parameter, g, is controlled by the size, shape, and optical index of the scattering particles employed. Experimentally, this parameter can be adjusted by particle material selection or, for a given material, through particle size modification and/or selection.

9. Design Configurations to Maximize Light Extraction

If we solve the model with the typical values for the OLED parameters described above and set S to zero to describe the typical case with no volume scattering, we get a value for the light extraction term, $\eta_{s-a}$ of 0.44 which is in agreement with the usual estimates (Eq. 14). From this, one can then calculate the total extraction efficiency if the efficiency in extracting light from the active layers of the device into the OLED substrate; i.e., $\eta_{OLED-s}$, is known. Highly accurate estimates of $\eta_{OLED-s}$ can be calculated using the microcavity models developed in the literature. A simple estimate is obtained by ignoring detailed microcavity effects and assuming the that the efficiency of going from the OLED layers to the substrate $\eta_{OLED-s}$, can be modeled by the Fresnel equation; i.e., $\eta_{OLED-s}=(n_{substrate}/n_{OLED})^2$, and assuming a Lambertian emission profile within the OLED layer. For example, setting the index of the glass substrate, n, to 1.5 and OLED active index to 1.7, then $\eta_{OLED-s}=(1.5/1.7)^2=0.78$. If we substitute this simple estimate along with our model results with scattering set to zero into Equation 1 we get a prediction of output coupling efficiency without volume scattering of $(0.75)*0.44=0.33$, which is similar to the results obtained by Kim et. al. for polymeric OLEDs.

In the following, we show the results of model calculations of $\eta_{s-a}$ with volume scattering included. We then use these to discuss the tradeoffs between design parameters and overall output extraction efficiency.

10. OLED Reflectivity

Figure 2:
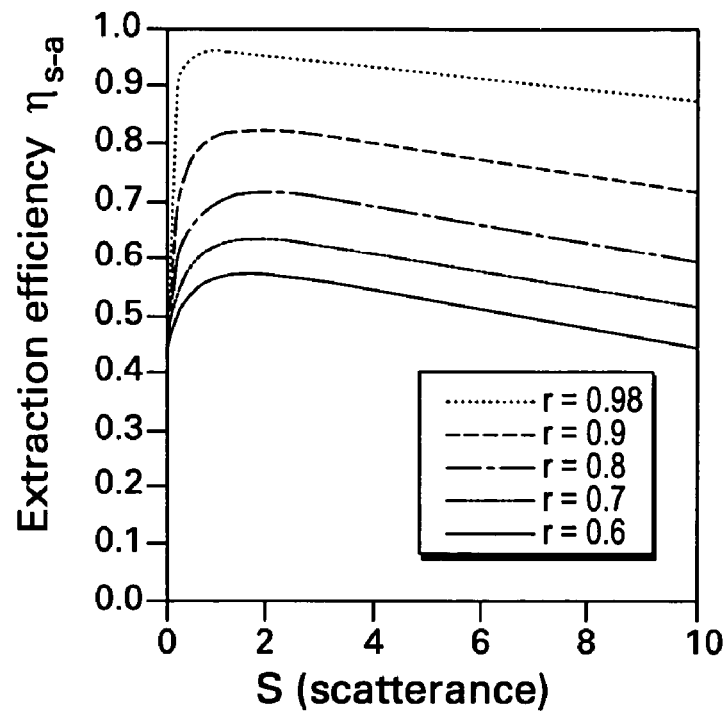
FIG. 2: Calculated substrate to air extraction efficiency, $\eta_{s-a}$ as a function of scatterance assuming different values of the cathode reflectivity. The input light distribution was assumed to have a Lambertian profile, the index, n, was set=1.5 and the asymmetry parameter, g, was set at 0.8

We find that in the presence of light scattering the most critical parameter in the determination of light extraction is the effective cathode reflectivity. In FIG. 2, extraction efficiency is plotted versus scatterance for different values of the effective cathode reflectivity. Note that for the chosen range of effective reflectivity values, there is a large range of scatterance values where the substrate-air extraction efficiency is enhanced relative to the zero scatterance value (0.44). As the effective reflectivity decreases, the maximum enhancement also decreases. Although not depicted in the figure, we find that enhancement still occurs as long as the effective reflectivity is greater than 0.2. For high cathode reflectivity, $\eta_{s-a}$ can be nearly unity i.e. very efficient "photon recycling" occurs. Intuitively, this is expected since, in the absence of losses a given photon can impinge upon the interface many times until in escapes. For a given reflectivity, the overall shape of the curve as a function of scatterance is also readily explained. At low values of scatterance, waveguiding within the substrate is not completely suppressed, while at very high values of scatterance, the light is mostly reflected from the substrate back to the lossy cathode. The peak value is the point where these two effects are balanced. Note that for a typical OLED reflectivity of 0.8, the extraction efficiency is enhanced by approximately a factor of 2 from the zero scatterance value. Thus the total output coupling efficiency is increased from ~0.3 to ~0.6.

11. Scattering Particle Shape and Size

Figure 3:
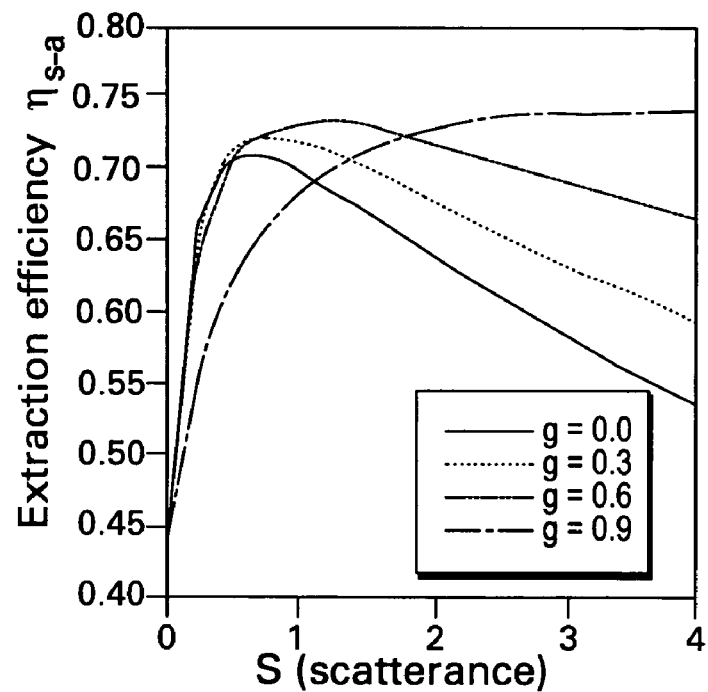
FIG. 3: Calculated enhancement of OLED light output as a function of scatterance for different values of the asymmetry parameter g. The optical index n, was set equal to 1.5 and the cathode reflectance was set to 0.8.

In our model, the effects of the particle shape and size are contained within a single parameter, g. In FIG. 3, we plot $\eta_{s-a}$ vs. scatterance for four different values of g ranging from g=0 to g=0.9. The emission profile was assumed to be lambertian (z=1), and the reflectance of the cathode was set at 0.8. Note that for each value of g, there is a peak in extraction efficiency at a particular scatterance value as expected from FIG. 2. However, as the value of g is increased the peak position is shifted to higher values of the scatterance. Physically, it is possible to understand the reason for this shift. The parameter g represents how much, on average, the scattered light is deviated from its original direction. Thus particles that are characterized by values of g near 1 do not efficiently deflect the incident beam, and at low loadings, should exhibit extraction efficiencies similar to non-scattering substrates. In this case, optimal light extraction will occur only at very large values of scatterance. On the other hand, low values of g imply better scattering efficiency and hence less scatterance is required to achieve optimal scattering. Thus, as g is varied between 0 and 1, one expects that the optimal value of S for light extraction should be shifted to higher values. Ultimately, in the limit where g goes to 1, infinite scatterance would be required to achieve optimal light extraction.

It should be noted that as g increases, the value of the peak efficiency also increases. However, this increase in peak value is relatively small, from 0.71 to 0.74. Thus, it seems that, as long as there is design flexibility in choosing the scatterance, the maximum attainable extraction efficiency is nearly independent of g—and hence independent of scattering particle size and shape. However, the falloff of $\eta_{s-a}$ as S increases becomes more gradual as g is increased, which implies there is a much wider operating range for the loading fraction of particles that exhibit higher values of g. Thus, to maximize design flexibility and tolerance, larger grained scattering particles that exhibit higher value of g are preferred.

13. Substrate Index of Refraction

In the absence of scattering, the reflectance of a flat substrate-air boundary is determined by the index of refraction in the substrate. To test if this remains true in the presence of light scattering, in FIG. 4 we plot the calculated extraction efficiency as a function of cathode reflectance for different values of substrate index. The scatterance in each case was set to a value that maximized the calculated light extraction. As expected the required scatterance was non-zero for all substrate indices except for n=1. Consistent with the discussion in Section (A)(10), for all values of n greater than 1, the extraction efficiency increases to the maximum possible value of unity as the effective cathode reflectance increases towards unity. However, for lower values of cathode reflectance, the optical index of the substrate sets an upper limit on the extraction efficiency, $\eta_{s-a}$ which increases as the substrate index decreases. Thus, optimization of $\eta_{s-a}$ requires the use of low index substrates.

Figure 4:
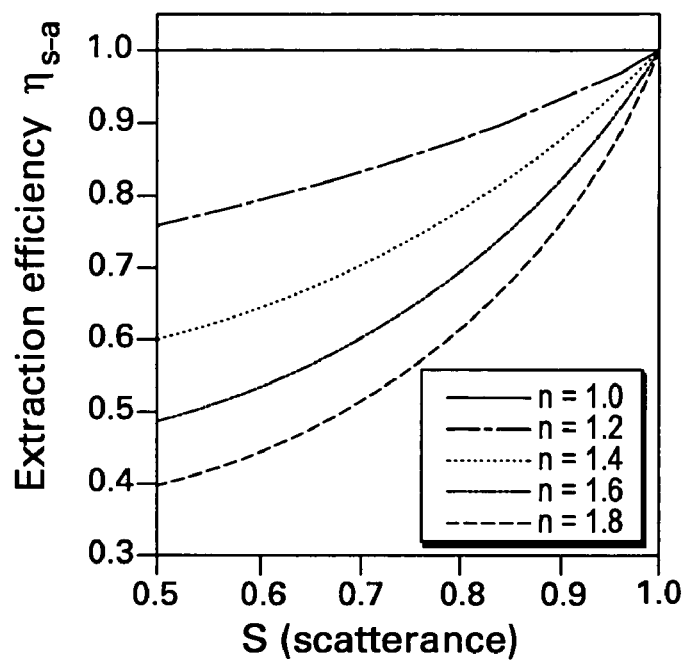
FIG. 4: Calculated substrate-to-air extraction efficiency, $\eta_{s-a}$ assuming optimum values of the scatterance as a function of substrate index of refraction. The different curves assume different values for the substrate index.

FIG. 4 demonstrates that maximizing $\eta_{s-a}$ requires minimizing the index of refraction of the substrate. However, changing the substrate index also affects $\eta_{oled-s}$. In fact, if one ignores optical microcavity effects, maximization of $\eta_{oled-s}$, ideally requires a substrate index matched to that of the active organic layers (n~1.7) to eliminate Fresnel reflection and waveguiding within the active layers. This leads to the following question: To maximize total extraction efficieny, is it better to use a low index substrate, and maximize $\eta_{s-a}$ at the expense of $\eta_{oled-s}$ or is it better to use a high index substrate and maximize $\eta_{oled-s}$ at the expense of $\eta_{s-a}$? In the OLED literature, there are two separate answers to this question. In one case it was shown that increasing the substrate index and texturing the top surface to increase $\eta_{s-a}$ resulted in increased OLED output. On the other hand, reducing the effective optical index of the substrate was also shown to increase light output. Which approach is best from the point of view of maximizing the overall extraction efficiency, $\eta_{ex}$, (Eq 1), requires an analysis of the microcavity structure, which affects both $\eta_{OLED-s}$ and $\eta_{s-a}$ through angular emission modification (the z parameter in our model). Depending upon the exact OLED structure it is possible to obtain improvements via both routes. While detailed design optimization of the combined microcavity and scattering is beyond the scope of our present discussion, our model does allow us to illustrate some of the possible tradeoffs between increased light scattering and microcavity optimization on $\eta_{s-a}$; we explore these in the next section.

15. Influence of Optical Microcavity

Figure 5:
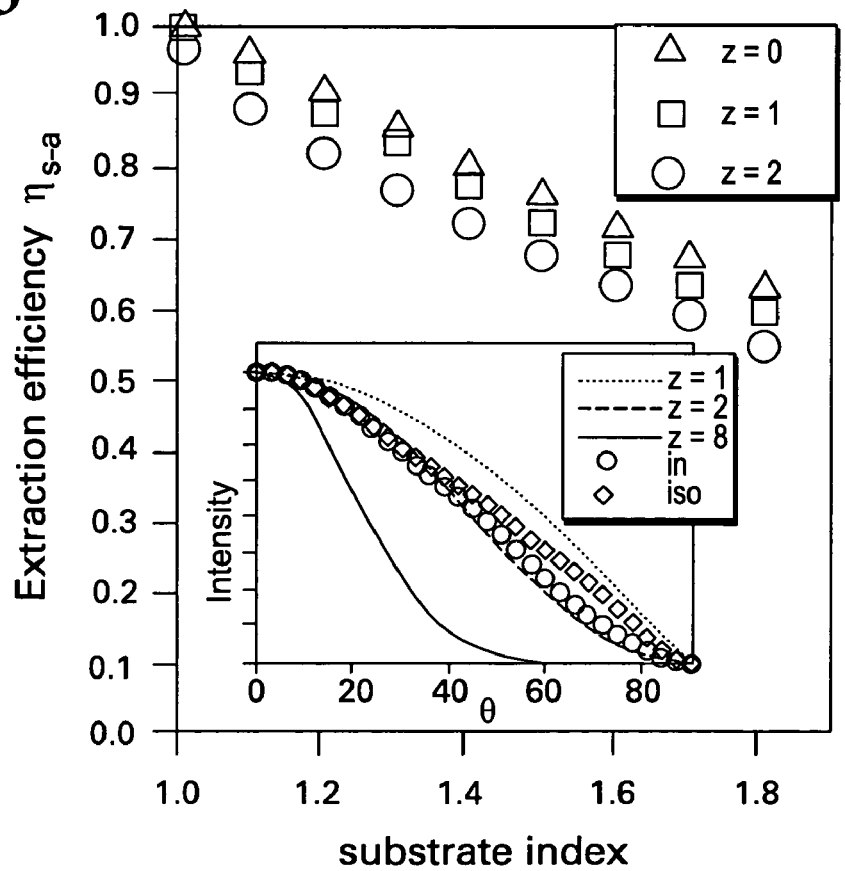
FIG. 5: Calculated substrate to air extraction efficiency, $\eta_{s-a}$ assuming optimum values of the scatterance as a function of substrate index of refraction for two different angular emission profiles. The assumed cathode reflectivity was 0.79, the anisotropy, g, was 0.9.Inset: plot of angular emission profiles for different values of z (solid lines). For comparision, the polarization averaged results of a calculation using a microcavity model of a standard OLED structure are shown assuming both isotropically oriented dipoles (squares) and dipoles oriented parallel to the plane of the OLED (circles).

The effect of the optical microcavity structure of an OLED on $\eta_{s-a}$ can roughly be taken into account in this model through modifying z, which determines $D(\theta)$. The inset to FIG. 5 shows the light distribution as a function of angle for different values of z (solid lines). For comparison, we show a complete optical microcavity calculation of the angular emission from a typical polymer OLED device structure. Specifically, we show the calculated polarization averaged angular emission profile using the method described by Crawford, which is similar to the other detailed models presented in the literature. We have assumed that the emission occurs from a well-defined plane in the device, with either dipoles aligned parallel to the electrodes or isotropically oriented. It should be noted that while the output of the microcavity calculations depends in detail upon the assumptions used for layer thickness, indices of refraction, and emission, the calculated distributions presented here are representative of the typical emission pattern observed in OLED devices where strong microcavity effects are not specifically engineered into the device structure. For such cases, we have found that in general, values of z less than 2 provide a reasonable approximation for $D(\theta)$.

In order to ascertain the interplay between optical microcavity effects and scattering enhancement of $\eta_{s-a}$ on the choice of substrate index, model calculations were performed to maximize $\eta_{s-a}$ by optimizing the scatterance for three different input angular distributions—z=0 (isotropic distribution), z=1 (lambertian distribution), and z=2. The calculations were performed as a function of substrate index, the scatterance was optimized yield the best extraction efficiency and the anisotropy, g, was et eqaul to 0.9. The results are depicted in FIG. 5. One can see that, for each z value, the curves exhibit the same basic behavior as a function of substrate index. This indicates that, for this range of z, which is typical of standard OLED devices without specifically engineered strong microcavity effects, the choice of substrate index of refraction is not complicated by coupling between microcavity effects and scattering enhancement effects.

Figure 6:
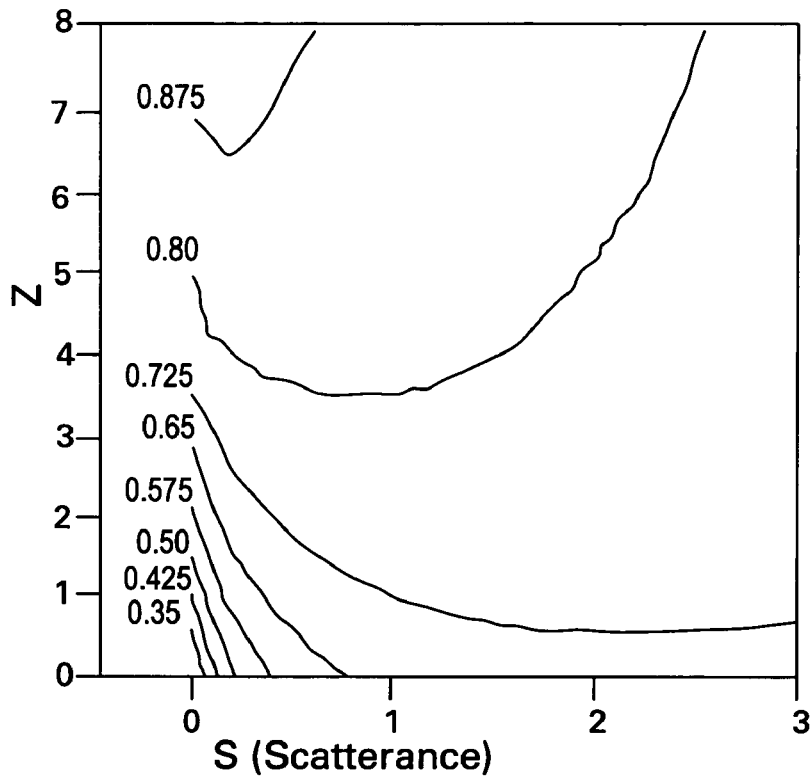
FIG. 6: shows the variation of extraction efficiency as a function of both scatterance S and angular emission profile z.

Strong microcavities can be engineered into an OLED, for instance, with a dielectric stack mirror or using thin metal films. In such cases, much more peaked angular dependence (eg. z=8) is possible and thus a strong microcavity has the potential to increase the extraction efficiency by ensuring that most of the light is emitted within the critical angle escape cone. It is thus of interest to examine how a strong microcavity interacts with volume scattering. FIG. 6 presents the results of a model calculation of $\eta_{s-a}$ versus both scatterance and z. Here a substrate index of 1.5 and an anisotropy value of 0.8 was assumed. The weak microcavity regime typical of most OLEDs corresponds to the area where z is less than 2. Here, one can see that finite scattering (S>0) is always beneficial in enhancing external quantum efficiency ("QE"). The opposite behavior occurs for strong microcavities (z>6) where light extraction efficiency decreases as scattering is introduced. This occurs because scattering diverts some of the highly forward-directed light output away from the critical-angle escape cone. However, this efficiency decrease is relatively gradual as S is increased. In fact, one can see that the difference in $\eta_{s-a}$ between using a strong microcavity without scattering (eg. z=8 and S=0) and using a weak microcavity with optimized scattering (eg. z=2 and S~2.5) is only ~0.2. In addition, it is important to note that the angular emission from a strong microcavity is also highly wavelength dependent. So for a broad light source such as typical OLED and especially a white light OLED, it is difficult to achieve a high z value averaged over all emission wavelengths. For such cases, it is likely that a weak microcavity with optimized scattering is the easier and more robust method for achieving external efficiency enhancement.

Appendix A—Implementation of the Discrete Ordinate Model 16.1 System of Linear Differential Equations The discrete ordinate (DO) approximation was implemented, including some improvements in the numerical techniques. Detailed equations for single particle scattering, initial and boundary conditions in terms of the discrete ordinate model will be presented below. Unless otherwise noted, the discussion here employs the same notation as presented above.

In the DO model, the angular deviation from plane normal, θ, is discretized into a grid of N/2 forward and N/2 backward angular channels. The flux in each angular channel is then a function of the propagation distance into the medium, x, and the channel index. It is also convenient to use the convention that the backward directed channels are divided so that the angular grid is symmetric with respect to inversion about the surface plane and are labeled so that $d\omega_N = d\omega_1$, $d\omega_{N-1} = d\omega_2$ . . . etc. Since one is replacing an integral with a sum, there are several choices for the grid. P. S. Mudgett and L. W. Richards, Appl. Optics, Vol. 10, 1485 (1971), have found that the grid spacing should 1) adequately accounts for the boundary conditions (i.e., the sharp rise in reflectivity near the critical angle), and 2) is symmetric with respect to inversion of the forward and backward directions, i.e. for every forward channel that spans a certain solid angle dω, there is an equivalent back channel. If these two conditions are met, then most grid spacing schemes will provide numerically satisfactory answers.

Having reduced the problem of radiative transfer to the solution of a system of n linear differential equations (Equation 14), we now simplify the notation to obtain the following system of linear differential equations:

$$\frac{dF_i}{dx} = \sum_{j=1}^{N} S_{ij} F_j \quad i \le N/2 \quad \text{(A1)}$$

$$-\frac{dF_i}{dx} = \sum_{j=1}^{N} S_{ij} F_j \quad i > N/2$$

where $S_{ij}$ is the matrix element that scatters the flux from angular channel j into angular channel i. The values of the individual matrix elements, $S_{ij}$ which couple one angular channel to another are a function of the value of θ and the phase function which describes the angular dependence of each scattering event. The coupling matrix elements are then given by:

$$S_{ij} = \frac{\omega_i S}{4\pi |\langle \mu_j \rangle|} \sum_{l=0}^{L} a_l P_l(\mu_i) P_l(\mu_j) \quad i \ne j \quad \text{(A2)}$$

and

-continued $$S_{jj} = -\frac{k}{|\langle\mu_i\rangle|} - \sum_{\substack{m=1\\m\neq j}}^{N} S_{mj} \quad (A3)$$

Here $\omega_i$ is the solid angle of the $i^{th}$ channel, s is the inverse mean distance between scattering events, k in the mean free path between absorption events and $a_1$ is the $1^{th}$ coefficient in the expansion of the phase function in terms of the Legendre polynomials. Numerical stability is enhanced if k is always set above some small value ~0.0001.

The coupled set of linear equation may now be readily solved. Following the substitution $\Sigma_{ij} = S_{ij}$ ($i \leq = N/2$); $\Sigma_{ij} = -S_{ij}$ ($i > N/2$) we write the following equation:

$$\left(\overline{\Sigma} - \overline{I}\frac{d}{dx}\right)\overline{F} = 0 \quad (A4)$$

where $\overline{I}$ is the identity matrix and $\overline{F}$ then has the following solution:

$$F_i = \sum_{j=1}^{N} A_{ij} C_j e^{\lambda_j x} \quad (A5)$$

where $\overline{A}$ is the eigenvector matrix of $\overline{\Sigma}$, $\lambda$ are the eigenvalues, and $\overline{C}$ is determined from the boundary and initial conditions:

16.2 Discretized Boundary and Initial Conditions

The initial conditions of the problem are determined by the micro-optics of the active layers of the OLED device. The two main outputs of this model are the total efficiency of coupling light into the scattering substrate, $\eta_{OLED-s}$ and the angular distribution of the coupled light. These two quantities, when discretized, yield the initial conditions $\overline{D}$, given by:

$$D_i = \omega_i \cos(\theta_i)^z = \omega_i \mu_i^z \quad i = 1, 2 \ldots N/2 \quad (A6)$$

$$D_i = 0 \qquad i = N/2+1, N/2+2 \ldots N$$

The boundary conditions of the problem are determined by the index of refraction of the substrate and the surface roughness and patterning of each surface. These are described by the Bidirectional reflectance function (BDRF), which in the discrete notation leads to a matrix of coefficients $R_{Xmi}$ that describe the reflection from the i th channel to the m th channel at the top interface. For a flat top surface, the reflectivity is:

$$R_{mi}^X = \frac{R_i^\parallel + R_i^\perp}{2} \quad (A7)$$

$$R_{ii}^X = 1 - \frac{R_i^\parallel + R_i^\perp}{2} \quad i = 1, 2 \ldots N/2, m = N - i + 1$$

The specular reflection coefficents are given by the Fresnel equations:

$$R_i^\perp = \left|\frac{\langle\mu_i\rangle - n^{-1}\beta_i}{\langle\mu_i\rangle + n^{-1}\beta_i}\right|^2 \quad (A8)$$

$$R_i^\parallel = \left|\frac{\beta_i - n^{-1}\langle\mu_i\rangle}{\beta_i + n^{-1}\langle\mu_i\rangle}\right|^2 \quad (A9)$$

and $$\beta_i = \sqrt{1 - n^2(1 - \langle\mu_i\rangle^2)} \quad (A10)$$

The reflectivity of the back interface depends upon nature of system. For a free standing film with air on both sides, the back reflectivity $R^0_{im}$ is equal to $R^X_{mi}$. In OLEDs, the back reflectivity is determined by the intrinsic reflectivity of the OLED. Based upon calculations of the reflectivity of metal on dielectric films one expects a relatively weak polarization averaged angular dependence of reflectivity, thus, we choose to parameterize the cathode, multilayer and absorption losses in the polymer layer by a single, angle independent effective reflectivity, $R_0$. For very large devices this value may be estimated experimentally, in finite devices it will have a somewhat lower effective value due to edge effects. We now are able to define an equation for $\overline{C}$ at the back surface:

$$\sum_{j=1}^{N} C_j(A_{ij} - R_0 A_{mj}) = D_i \quad i = 1 \ldots N/2; m = N+1-i \quad (A11)$$

and at the front surface:

$$\sum_{j=1}^{N} C_j(A_{mj} - R_{mi}^X A_{ij})\exp(\lambda_j X) = 0 \quad (A12)$$

$$i = N/2+1 \ldots N; m = N+1-i$$

Here X is the total thickness of the sample. All that remains is to solve Eqns A11-A12 and input the results into Eqn. A5, which yields the flux for each angular channel and depth in the sample. Before solving it is helpful to make the following substitution which serves to prevent errors due to numerical overflow:

$$\tilde{C}_j = C_j\exp(-\lambda_j X) \quad \lambda_j > 0 \quad (A13)$$

$$\tilde{C}_j = C_j \qquad \lambda_j \leq 0$$

we now define a matrix $\overline{M}$ by:

if $\lambda_j \leq 0$      $i = 1, 2 \ldots N/2$      (A14)

$M_{ij} = A_{ij} - R_0 A_{mj}$      $j = 1, 2 \ldots N$ $M_{mj} = (A_{mj} - R_{mi}^X A_{ij})\exp(\lambda_j X)$      $m = N+1-i$ if $\lambda_j > 0$ $M_{ij} = (A_{ij} - R_0 A_{mj})\exp(-\lambda_j X)$ -continued $$M_{mj} = (A_{mj} - R_{mi}^X A_{ij})$$

This leads to:

$$\tilde{C} = \overline{M}^{-1}\overline{D} \tag{A15}$$

Given $\tilde{C}$, the flux F is completely determined at all points in the scattering medium.

B. Application of the Henyey-Greenstein Phase Function to the Model

This section will present a set of experimental measurements of both the model input parameters and the relative extraction efficiency as a function of volumetric light scattering in order to test the model's capability for predicting the extraction efficiency of real devices.

Our goal is made possible by the fact that a light emitting OLED and a scattering film may be separately fabricated, individually characterized and then optically coupled together. We first characterize all the relevant parameters of freestanding, scattering films, using the usual tools of reflectance, transmission and angularly resolved scattering. We then collect optical data on the OLED device, characterizing its reflectance and emission properties, again using standard methods. Given the optical characteristics of the OLED and the film, the radiative transport model predicts the effect on light output when the two pieces are combined, without the inclusion of any additional adjustable parameters. In addition, we can successively attach many different scattering films to the same OLED, and accurately determine how the light output varies as function of different scattering parameters. Thus, the model's ability to predict the functional dependence of light output as a function of scattering parameters can be tested. These detailed comparisons of both magnitude and functional dependencies provide a stringent test of the radiative transport model.

Our discussion will be organized into two main sections. The first section introduces the critical concepts from the model necessary to understand our interpretation of the experimental data. The discussion of the model differs considerably from the presentation given in the companion paper in that we concentrate on providing a qualitative overview and physical picture rather than a detailed development. The numerical solution of the model is described in the companion paper and elsewhere in the literature. The second section of the paper contains a detailed exposition of our experimental methodologies and the comparison of the experimental data to model calculations.

In this discussion, it is useful to decompose the total extraction efficiency $\eta_{ex}$ into two components: i.e.

$$\eta_{ex} = \eta_{OLED-s}\eta_{s-a} \tag{19}$$

where $\eta_{OLED-s}$ is the faction of the electrically generated light that is coupled into the substrate, $\eta_{s-a}$ is the faction of light that is coupled into the substrate that is emitted into the ambient. This decomposition is analogous to the usual distinction made between ITO/organic and substrate wave guided modes. In this paper, the latter term is the primary focus. In particular, we examine the effects of volumetric light scattering upon the fraction of light emitted into the ambient, $\eta_{s-a}$.

Figure 7:
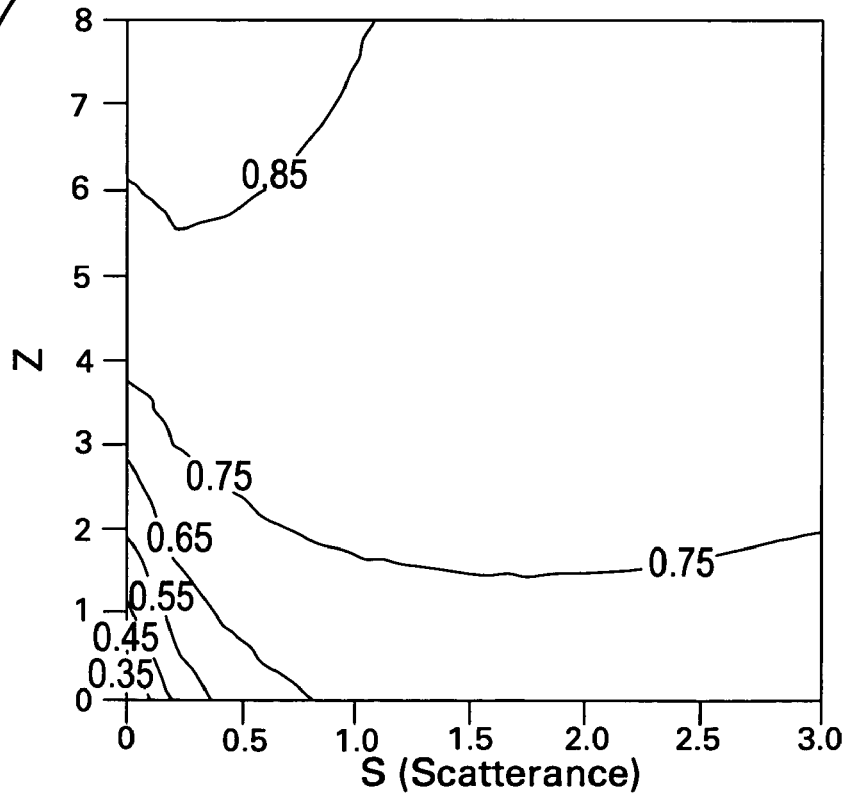
FIG. 7: Contour plot showing the variation of extraction efficiency $\eta_{s-a}$ as a function of both the scatterance and the angular emission profile.

The basic physical processes that must be modeled are illustrated schematically in FIG. 7. On the left side of the figure is shown an idealized OLED and a scattering, but non-absorbing, layer. In translating the physical structure to a mathematical model, we group the OLED active layers into a single layer and focus primarily on the different physical processes that occur within the scattering layer. (FIG. 7 right) These can be illustrated by following the history of a typical ray from the OLED to the air. Light emerges from the active layers of the OLED with a angular distribution characterized by the function D(θ) at position "a". The ray impinges upon a particulate scatterer at "b", and is back scattered to point "c", which is the surface of the active layers of the OLED. The ray is reflected at point "c", but also attenuated due to the finite reflectivity $R_{OLED}$ of the OLED. The ray then travels to point "d", is scattered again, and reaches the top air-glass interface a point e with an angle of incidence that exceeds the critical angle and undergoes total internal reflection. The ray is reflected back to a scattering particle ("f"), is back-scattered toward the air substrate interface (point "g"). This time the angle of incidence is less than the critical angle and the ray is transmitted across the interface.

This example highlights the necessary physical parameters needed to model volume scattering in OLEDs. First, the internal angular distribution of light, D(θ), as it emerges from the OLED and goes into the substrate must be characterized. Due to optical microcavity effects, D(θ), is in general not a simple function of angle and is polarization dependent. In many cases, the polarization may be averaged, and the distribution approximated by a simple form:

$$D(\theta) = \cos(\theta)^z \tag{20}$$

which is characterized by a single parameter, z. Second, the angular distribution of each single particle scattering event must be determined. This distribution is given by the phase function which is expressed as the relationship between the input intensity I, and output intensity, I':

$$I' = p(\theta', \theta)I \tag{21}$$

For simplicity, we have assumed azimuthal symmetry and polarization independence, which is adequate to describe many scattering systems. In the limit of isotropic scattering, $p(\theta', \theta) = 1$. However, for most micron sized particles $p(\theta', \theta)$ is peaked in the forward direction, i.e. where the difference $\theta' - \theta$ is small. The form of the phase function can be quite complex, but we shall further simplify our analysis by using a one parameter form of the phase function due to Henyey and Greenstein:

$$p_{1HG}(\theta, \theta') = \frac{1 - g^2}{(1 + g^2 - 2g\cos(\theta - \theta'))^{3/2}} \tag{22}$$

where g, the asymmetry factor, is the expectation value of $\cos(\theta - \theta')$. Thus, g=1 implies that each scattering event does not deflect the beam, g=−1 implies that each scattering event back scatters the beam along the incident direction, and g=0 implies isotropic scattering.

The third necessary physical parameter is the probability that a scattering event will occur as the ray traverses the substrate. This is a product of the scattering cross-section, the particle concentration, and the total substrate thickness. It can be characterize by a single parameter, S, the total scatterance. The fourth necessary input is the effective reflectance of the OLED active layers and cathode. We assume specular, angle independent reflection characterized by a single parameter $R_{OLED}$. Finally, the critical angle given by:

$$\theta_c = \sin^{-1}\left(\frac{1}{n}\right) \quad (23)$$

must be measured. Here n represents the index of refraction of the substrate.

The five physical parameters—z, g, S, $R_{OLED}$, and n—determine the extraction efficiency from an OLED device. While the introduction of these parameters has been somewhat heuristic, this is the same parameter set that emerged from a more formal physical analysis in the companion paper. The five parameters can be grouped into two categories, one set—n, z, and $R_{OLED}$—is common to all large, planar OLEDs. The other set—n, S, and g—is common to all scattering layers. For simplicity, we have assumed a common index of refraction for both the OLED substrate and the scattering layer. This grouping of the model input parameters matches our experimental design of separate measurements of OLED and scattering film optical properties.

The physical picture presented in FIG. 7 and developed in the previous paragraph can be expressed mathematically through the following integro-differential equation $$-\frac{dF(x',\mu)}{dx'} = \frac{(K+S)}{\mu}F(x',\mu) - \int_{-1}^{1}\frac{S}{2\mu'}\sum_{l}g^l(2l+1)P_l(\mu)P_l(\mu')F(x',\mu')d\mu' \quad (24)$$

The flux, F, for a given wavelength, is defined as the amount of light passing through an area dA, in the plane parallel to the interfaces, in a slice of solid angle dω. K and S are the total absorbance and scatterance. For the work described in this paper, K is nearly 0. We have made the substitution $\mu_i\langle=(\cos(\theta_i))\rangle$, and $P_1$ are the Legendre polynomials of order 1. x' is the reduced distance into the medium, x'=x/X, so the boundaries are at x'=0 and x'=1. g is the anisotropy of each scattering event as defined by Equation 23.

With three parameters, Equation 24 gives the flux at every point in the system and so completely solves the predicted light distribution for plane parallel systems in the presence of scattering. Different experimental geometries are specified through appropriate modification of the boundary and initial conditions. For purposes of this paper, there are two basic experimental geometries—a free-standing scattering film and scattering film coupled with an OLED; we now present our formulation of these boundary and initial conditions for our two geometries.

1. Free Standing Film

For a free-standing film with dispersed scattering particles, the boundary conditions to equation 6 are given by the specular reflection coefficients for each face. These are given by the Fresnel equations:

$$R_{0(1)}(\mu) = \frac{1}{2}(R^{\|}(\mu) + R^{\perp}(\mu)) \quad (25)$$

$$R^{\perp}(\mu) = \left|\frac{\mu - n^{-1}\beta}{\mu + n^{-1}\beta}\right|^2 \quad (26)$$

-continued $$R^{\|}(\theta) = \left|\frac{\beta - n^{-1}\mu}{\beta + n^{-1}\mu}\right|^2 \quad (27)$$

The subscripts denote the location of the boundary, either at x=0 or x=1, in this case the boundary conditions are similar at both interfaces. β is defined as:

$$\beta = \sqrt{1-n^2(1-\mu^2)} \quad (28)$$

In the experiments described in section 2 below, the free standing film is interrogated with a collimated beam of light, In this case the input light distribution is given by a delta function:

$$D(\theta) = \delta(\theta) \quad (29)$$

Given these conditions and a set of corresponding set of S, K, and g values, Equation 24 can be solved to provide the total reflectance, R, transmission, T, as follows:

$$R = \int_{-1}^{0}(1-R_0(\mu))F(0,\mu)d\mu \quad (30)$$

$$T = \int_{0}^{-1}(1-R_1(\mu))F(1,\mu)d\mu \quad (31)$$

The measured inline transmission, $T_{inline}$, is calculated by integrating the flux transported across the film-air interface over the half-angle subtended by the detector, $\theta_d$:

$$T_{inline} = \int_{\cos(\theta d)}^{1}(1-R_1(\mu))F(1,\mu)d\mu \quad (32)$$

2. OLED+Scattering Film

We also examine the case where the film is affixed to an OLED device. The input light distribution is now given by:

$$D(\theta) = \mu^z \quad (33)$$

where the parameter z describes the angular dependence of the OLED emission and is an experimental observable. The top boundary condition (at the air-film interface) is the same as for the free-standing film, but the bottom boundary condition (the OLED-film) interface is replaced by a specular reflectance condition given by:

$$R_0(\theta) = R_{OLED} \quad (34)$$

Using the model we can compute the total flux in each channel that is outcoupled to the ambient, $F^{out}(\theta)$ as a function of internal angle, θ:

$$F^{out}(\theta) = (1-R_1(\cos(\theta)))F(1,\cos(\theta)) \quad (35)$$

The internal flux at the boundary, $F^{out}(\theta)$, is related to the observed Flux as a function of angle φ outside the medium, $F^{ex}(\phi)$:

$$F^{ex}(\varphi) = F^{out}(\theta)\frac{d\Omega_{int}}{d\Omega_{ex}} = F^{out}(\theta)\frac{\cos(\varphi)}{n^2\cos(\theta)} \quad (36)$$

which appears as Equation 23 in Kim et. al., where the ratio in the middle and rightmost equations is the ratio of solid angles in each medium. The fraction of light out-coupled from the substrate to the air out of the total amount of light coupled into the substrate can be expressed as:

$$\eta_{s-a} = \frac{\int F^{out}(\theta)\sin(\theta)d\theta}{\int D(\theta)\sin(\theta)d\theta} \quad (37)$$

3. Experimental

In this section, experiments aimed at measuring the relevant scattering parameters from free-standing scattering films are described. In addition, measurements of the relevant physical parameters of an OLED device are described. The resulting parameters are then used to predict the effect on light output when the scattering film is optically coupled to the OLED device. As described below, this prediction uses no adjustable parameters. The actual effect on light output is then measured and compared to the prediction.

3.1 Scattering Properties of Freestanding Films

Film Fabrication

Freestanding tapes with variable optical scattering were prepared by mixing a known weight of non-visible light absorbing particles with 10 g of uncured PDMS resin (n=1.41 for the cured film). The two white powders used in this study were a sample of cool white (CW) phosphor ($d_{50}$=6 μm), and $ZrO_2$ powder ($d_{50}$=0.6 mm). The median particle sizes were determined via light scattering. Typical weight loadings ranged between 0.2%-1.76% for the $ZrO_2$, and 1%-20% for the cool white phosphor particles. Infinite plaque reflectivity measurements performed on both samples indicated very low visible light absorbance. The scattering films were prepared by tape casting prior to curing. Typical film thickness was about 400-600 μm.

Measurement of Scatterance (S)

To determine the degree of light scattering in the free standing films, it is necessary to use the radiative transport models in reverse, i.e. starting from and observed set of transmission and reflectance data, invert to obtain a set of S, K, and g. In general this procedure requires a non-linear fit of the three inputs (T, R, $T_{inline}$) to the three outputs (S, K, g), but in the cases where these is very little absorption (i.e. K~0); S is determined from the inline transmission directly via a Beer's law type expression:

$$S = -\ln(T_{inline}) \quad (38)$$

The measurement of inline transmission consisted of passing a chopped the 488 nm line of an Ar ion laser beam through a freestanding film. A 1 cm diameter diode connected to a preamplifier and then to a lock-in amplifier was placed a variable distance behind the suspended film. The angular resolution of the system was at least ~1° ($\theta_d$=0.5°) in all cases, and care was taken to mount the film so that the unscattered portion of the laser beam was not deflected away from the diode. The measurements were repeated at 3-5 different positions on each tape. The incident intensity of the laser beam on the diode was measured both with and without the sample in position and the two signals ratioed to yield an inline transmission. Power fluctuations of the stabilized diode were relatively small so that the leading source of variance in the determination of inline transmission was point-to-point variations in the particle concentration. The measured variation in the calculated scatterance, S was <+/−0.07. A possible systematic error is contamination the in line transmission signal by low angle light scattering that is stronger than the weak inline component. To guard against this possibility the inline transmission was measured as a function of distance from the detector, and care was take to ensure that the extracted value of S did not increase as the detector was moved farther away from the sample. For samples with relatively high particle loadings, we determined S via a linear fit of the scatterance versus the known weight loading. We find that for both our $ZrO_2$ and CW samples there is very little variation of S as a function of wavelength, consistent with the predictions of scattering theory for particles in this size regime.

Measurement of Scattering Anisotropy (g)

Given S, K, and n, we can measure g by fitting Equations 30-31 for transmission and reflectance; g is only adjustable parameter. The total transmission and reflectance spectra were measured using the integrating sphere accessory attached to a commercial UV-Vis spectrometer (Perkin-Elmer lamda-9). The error at any wavelength point was measured at +/−0.3%. We find that the for the larger CW particles there is almost no variation in these values as a functions of wavelength, whereas for the $ZrO_2$ loaded tapes, the tapes become slightly more reflective at shorter wavelengths. Given values of S (determined from our inline measurements), K (which we set to <0.001), and n of the PDMS, and g, Equation 23 predicts the values of total reflection and total transmittance. For our tapes we fit g to best match the observed transmission and reflectance values. This procedure is quite robust and our observed standard deviation in the determination of g, pooled over all samples, is 0.008. A comparison of the observed and calculated values of transmission and reflection at 488 nm for five of the tapes used in this study are presented in Table I. For micron sized particles one expects on the basis of Mie theory, only a weak variation in the value of g as the wavelength is changed. This was confirmed by analysis of the inline transmission using a 670 nm diode laser, where it was found that the calculated values of g at 670 nm (0.872 and 0.816 for the CW and $ZrO_2$ loaded samples respectively) are similar to those at 488 nm. We have now determined all the relevant optical parameters of the free standing scattering film, and thus we expect the radiative transport model to predict, without the use of any additional fitting parameters, the optical behavior for a wide variety of light input and output geometries. Thus, an independent test of the applicability of our model is a comparison of the calculated and measured angular dependence of the light scattered by the free-standing films. To perform such a test, a detector with radius r=0.5 cm was mounted on a rotating arm of length l=38.2 cm away from the scattering sample. A 670 nm laser beam was passed through the sample and intensity of the transmitted 670 nm light was then measured from 0° to 85°. The measured intensity of the angularly deviated components is related to the calculated flux by a scaling factor $f=5.4\times10^{-4}=\pi r^2/l^2$ which is the solid angle subtended by the detector. Using Equation 36:

$$\frac{I_{670}(\varphi)}{I_{670}^0} = F^{out}(\theta)\frac{d\Omega_{int}}{d\Omega_{ex}}f; \quad \theta > 0 \quad (39)$$

$$\frac{I_{670}(0)}{I_{670}^0} = \exp(-S)$$

Figure 8:
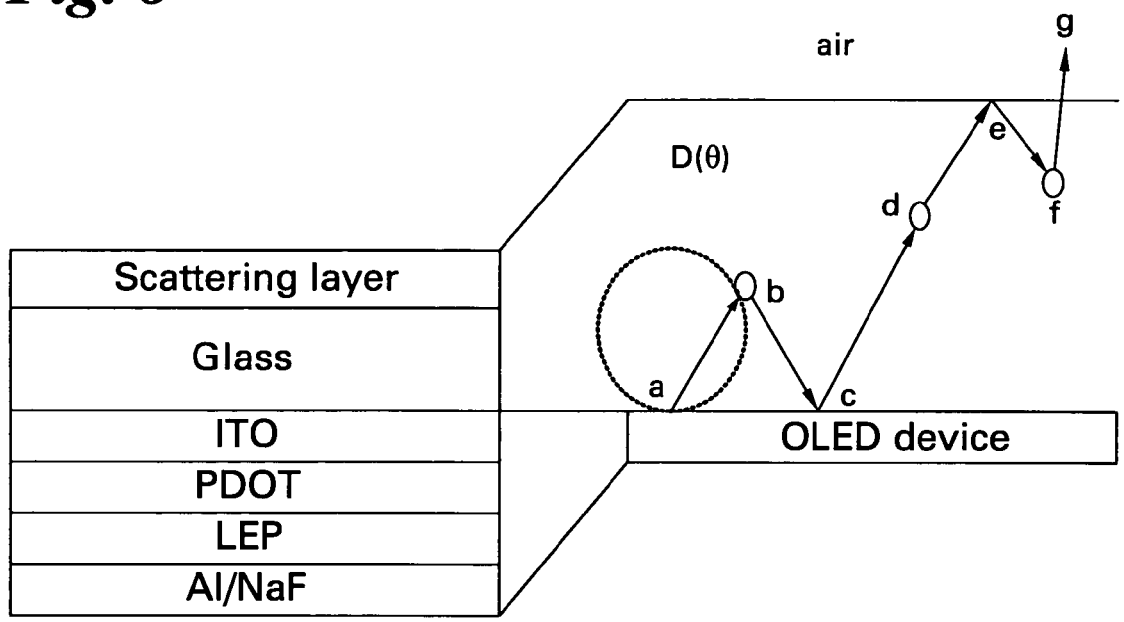
FIG. 8: A schematic illustration of the different physical processes which affect transport of light in a scattering medium. The line represents the history of a single prototypical ray whose interactions with the medium and scattering sites (labeled points a-g) are described in detail in the text.
Figure 9:
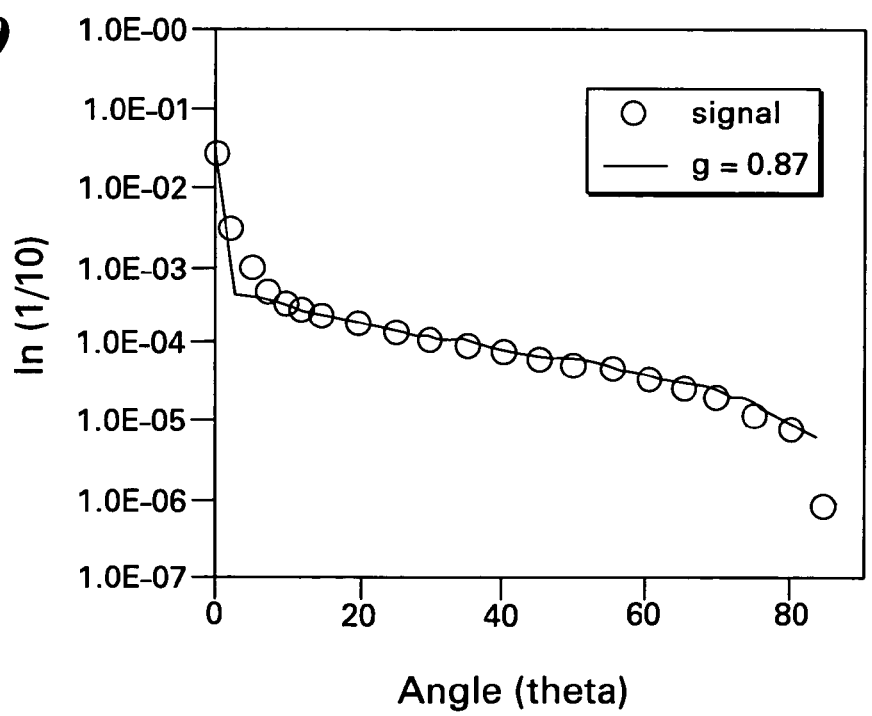
FIG. 9: Measured angular dependence of light scattering of a collimated 670 nm beam incident on a PDMS tape loaded with 'cool white' phosphor particles (open circles). The solid line is the radiative model prediction using the H-G phase function (Eqn.4) using g=0.87 derived from fitting the data in table I.

Since g, n, and S are already determined, we can use the solution to Equations 24-33 to determine $F^{out}(\theta)$, and compare it to the measured values of the ratio on the left hand side without further adjustment. In the top panel of FIG. 8 we plot the angularly resolved intensity versus angle for one tape (CW particles at 5.6% weight loading). In addition, we plot the predictions of the model (Equation 39) for different input values of g. Clearly the curve generated using a value of g=0.87 provides an acceptable description of the data. It possible to improve the fit to the data by introducing a two-parameter Henyey-Greenstein model, and more accurately accounting for the averaging effects introduced by the finite size of the detection diode, however, we find that using a two-parameter model does not significantly affect our calculation of the total transmission and reflection characteristics of the film and thus its use is not justified 3.2 Optical Properties of OLEDs Effective Reflectance The reflectance of a typical OLED was measured using the specular reflectance attachment of a commercial spectrometer. A blue emitting OLED was manufactured using the procedure and materials described in S. Moller et al., Appl. Phys. Lett., 3324 (2002). The reflectance spectrum was measured through the substrate and device (ITO+polymer) layers and is thus expected to be lower than the value of 0.91 obtained from calculating the reflectivity of a film of aluminum on glass. In FIG. 9, we compare the experimental reflectivity spectrum to typical OLED spectra measured in an integrating sphere. Averaging over the output spectrum of the OLED device results in an effective reflectivity of 0.79. In order to directly input this number into the radiative transfer model, the ideal OLED would be thin relative to the substrate area, and be uniformly reflective. The actual OLED tested had a 1" square active area OLED on a 1.5" glass substrate of 1 mm thickness, however, most of the non-active area of the OLED was coated with an aluminum film that was separated from the ITO anode by a thin insulating layer, and only 7% of the device area was non-reflective. Since this area is relatively small, and non-emissive, it should have a minor effect on the total light output; thus we set $R_{OLED}=0.79$.

Angular Dependence of OLED Light Emission

Figure 10:
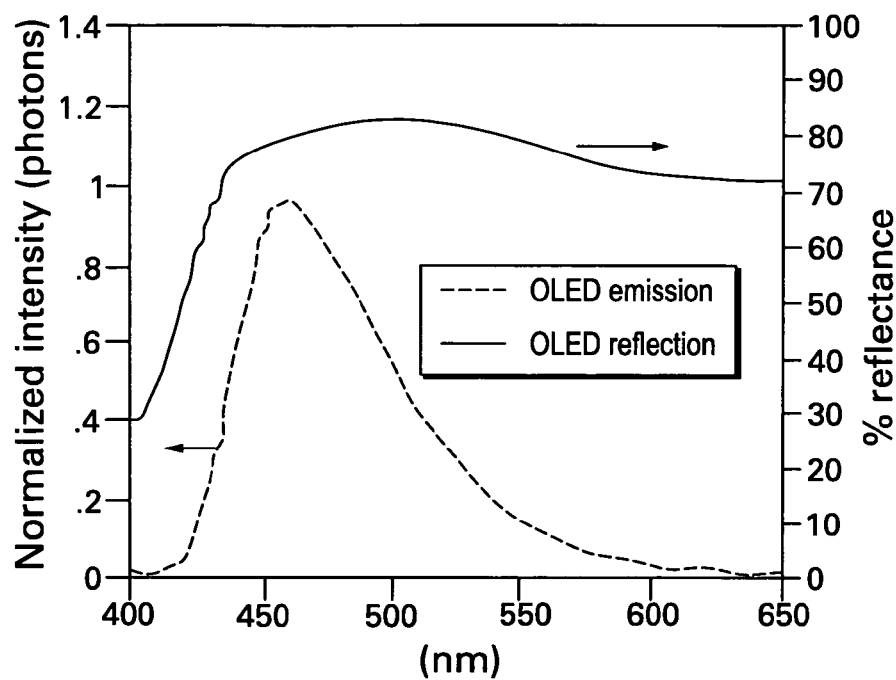
FIG. 10: Measured specular reflectivity of OLED device (right y axis) and typical blue OLED spectra measured in a integrating sphere (left y axis).

The angular dependence of the OLED light output as it goes from the OLED layers into the substrate sets the initial condition $D(\theta)$ in Equation 24. In principle, one could determine this internal angular distribution by measuring the external OLED light emission pattern using a methodology similar to our determination of the angular dependence of light scattering. The problem is that this would require deconvolution by the same ratio of solid angles that appears in Equation 36, making small changes in $D(\theta)$ hard to resolve. Thus, we set up a procedure to measure DD directly. In particular, we optically coupled the OLED to the center of a glass hemisphere and measured the light emitted as a function of angle from the hemisphere. This geometry effectively makes the ratio of solid angles equal to unity. In our experiments we place a small (¼" square) OLED at the center point of a 3" diameter glass hemisphere. Two methods were used to probe the angular emission. In the first, an optical fiber input coupler was rotated around the hemisphere and the light coupled into the fiber was coupled to a remote detector. In order to minimize the effects of fiber misalignment an iris aperture and an optical diffuser were mounted before the fiber input. The second measurement method utilized a small silicon diode rather than the fiber input coupler as the rotating component. The integrated intensity as a function of angle utilizing both measurement methods is shown FIG. 10. The solid line is a calculated emission profile of the form $D(\theta)=\cos(\theta)^{1.2}$. The factor of 1.2 is determined by fitting the observed signal level in the diode versus $\cos(\theta)$ on a log-log plot.

3.3 Light Output of OLEDs Coupled to Scattering Films

Given the complete characterization of the relevant properties of an OLED and a scattering film described above, the ultimate goal of this work is to predict the effect of coupling the scattering film to the OLED on light output. Accordingly, we define an enhancement factor $\epsilon$ as the total integrated light output from an OLED with the scattering tape divided by the same quantity without the scattering tape. We measure this quantity in the following manner. The OLED was placed inside an 18" diameter integrating sphere equipped with a fiber bundle leading to a ¼ m spectrometer with CCD detection. The OLED was mounted using a ¼" thick magnet on a white steel base. Thus, all light emerging in the forward hemisphere experience similar optical paths before detection. Light emerging from the sides of the OLED, traveling in the reverse direction, will strike the white base before being reflected into the sphere; some will be lost as a result of striking the back of the OLED, which is somewhat absorbing. A white light source (10W, tungsten filament) previously calibrated against a NIST traceable blackbody source was also mounted inside the sphere and provided an internal spectral calibration. The calibration was frequently checked and measured both with and without the OLED device in the sphere. Care was taken to ensure that the OLED was in a stable operating mode and that it was as clean as possible. A scattering tape was mounted on the on the surface of the OLED and the spectra measured. The tape was removed from the OLED and the measurement immediately repeated. We calculate the enhancement, $\epsilon$, the ratio of I(scattering)/I(no-scattering) for each scattering film. In FIG. 5 we plot the enhancement factor (left axis) vs. the observed scatterance for tapes made out of both cool white phosphor particles (top) and $ZrO_2$ particles (bottom). Error analysis indicates that the statistical uncertainty in the measurement of $\epsilon$ is +/−0.028. The data is represented by the solid squares and error bars. Note that a maximum enhancement factor of 1.41 is observed. The predicted enhancement based upon the radioactive transport model and experimentally measured input parameters (R=0.79, z=1.2, g and S indicated in the figure) is shown as the solid line. The agreement between prediction and experimental data is quite impressive—particulary given the absence of any independently adjustable parameters in the model.

Given the enhancement factor, it is possible to calculate the absolute value of the extraction efficiency $n_{s-a}$ of an OLED coupled with scattering film if one knows the absolute value of the extraction efficiency $n^0_{s-a}$ of the bare OLED as follows:

$$\eta_{s-a} = \eta_{s-a}^0 \epsilon \qquad (40)$$

In order to get an accurate estimate of $n^0_{s-a}$ one must consider finite size effects on an actual device. The primary effect of size is that some of the emission from the OLED occurs from the sides of the device. This has the effect of increasing the total outcoupling efficiency relative to an infinite device where no emission can come from the sides. Thus, the out-coupling efficiency that can be calculated analytically for an infinitely large OLED provides a lower limit for $n^0_{s-a}$.

$$\eta_{s-n}^0 > \int_0^{\theta_c} 2\cos^z(\theta)\sin\theta d\theta \qquad (41)$$

Assuming a substrate with index n=1.5, $\theta_c$=41.8, and our measured value of z=1.2, Equation 41 predicts a lower limit for n s-a of 0.469. A better estimate for $n_{s-a}^0$ can be obtained using ray-tracing calculations with the actual OLED geometry as well as its mount inside the integration sphere. Such calculations were performed and gave an estimate for $n^0_{s-a}$ of 0.534+/−0.035. This number, combined with Equation 22 was used to calculate the absolute extraction efficiency from the measured enhancement values. These are depicted as the right-hand axes in FIG. 11. Note that a maximum output coupling efficiency of 0.75 is observed with the cool-white phosphor.

4. Discussion

Figure 11:
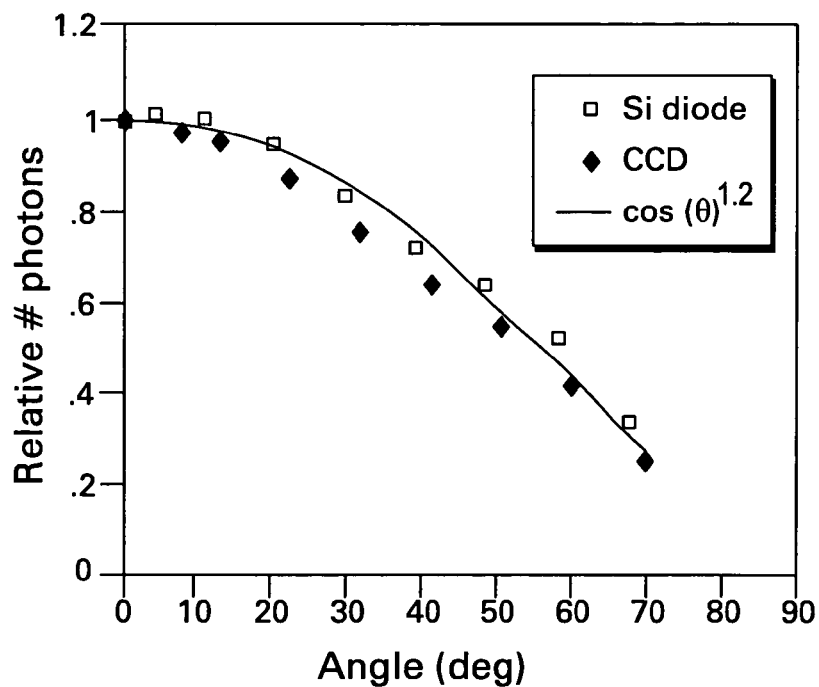
FIG. 11: Measured angular distribution of light intensity emitted by the OLED into the glass substrate, as measured using a glass hemisphere optically coupled to the OLED. The data as measured using both a Si detector (solid diamonds) and a fiber coupled CCD camera (open squares). The data are compared to the function $\cos(\theta)^{1.2}$ (solid-line)

The data and model presented in FIG. 11 can be described using a simple physical picture. In both data sets, there is an optimal value for the film scatterance, S. At low values of scatterance, waveguiding within the scattering medium is not completely suppressed, while at very high values of scatterance, the light is reflected from the scattering medium back to the lossy cathode. The peak value is the point where these two effects are balanced. According to our modeling, the position of this optimum value depends upon the value of g. The data in FIG. 11 clearly show this trend, as the optimal amount of scatterance in $ZrO_2$ loaded films is ~2, and the optimal amount for CW loaded films is ~3. More importantly, we observe a high level of agreement between the analytical model and the data, both in terms of the magnitude of in the light output enhancement, and in the trends in the light output as the scatterance and the phase function of the scattering particles are varied. Considering both the experimental error in our determination of the model input parameters, the possible errors in are determination of the absolute outcoupling efficiency are ~±7%.

To summarize our methodolgy: we have presented an experimental determination of the parameters that are needed to calculate the extraction efficiency $\eta_{s-a}$ and measurements of $\eta_{s-a}$ in OLED devices that are optically coupled to different scattering films. We first determine the scattering parameters, S and g, for each film that will be coupled to the OLED device, the OLED reflectivity, ($R_{OLED}$) and internal angular light distribution ($D(\theta)$). Finally, we couple each film to the OLED and measure the enhancement factor, $\epsilon$, which we define as the ratio of the number of photons with the scattering tape divided by the number of photons measured from the bare OLED. There is a linear relationship between $\epsilon$ and $\eta_{s-a}$ that connects our observations to the model and permits a detailed assessment of the model's accuracy and capabilities. Our analysis requires no free adjustable parameters, and the high level of agreement between fundamental physical models and detailed physical measurements provides a large degree of confidence in our estimate of the absolute extraction efficiency, and we now are able to use the radiative transport model to quantitatively compare and rank the effectiveness of different light out-coupling schemes. While in the experiments described herein examine only the contributions of volumetric light scattering to total light output, the effects of microcavities and simple extensions of the model to describe the effect of surface texturing may also be included.

5. Appendix B: Spectral Effects

Figure 12A:
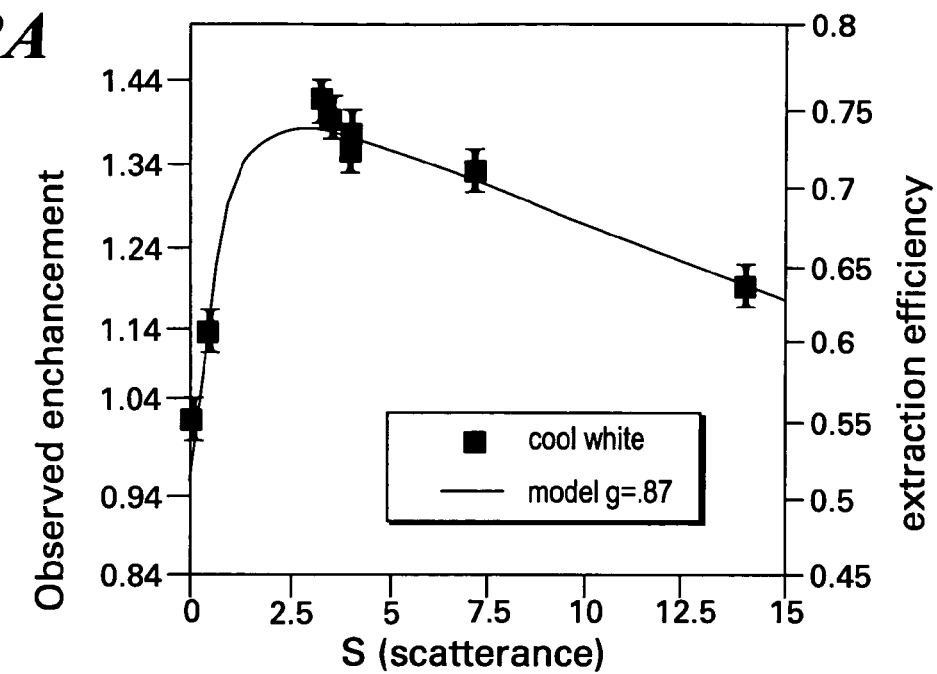
FIG. 12: Light output enhancement as a function of scatterance in the substrate. The left y-axis is the observed ratio of the OLED output when coupled to the scattering tape divided by the bare OLED output. The right y-axis is the calculated air-substrate extraction efficiency, $\eta_{s-a}$. Top: data obtained using PDMS tapes loaded with 'cool white' phosphor particles. The solid line is the output of the model with g=0.87 Bottom: data obtained using PDMS tapes loaded with $ZrO_2$ particles. The solid line is the output of the with g=0.79
Figure 12B:
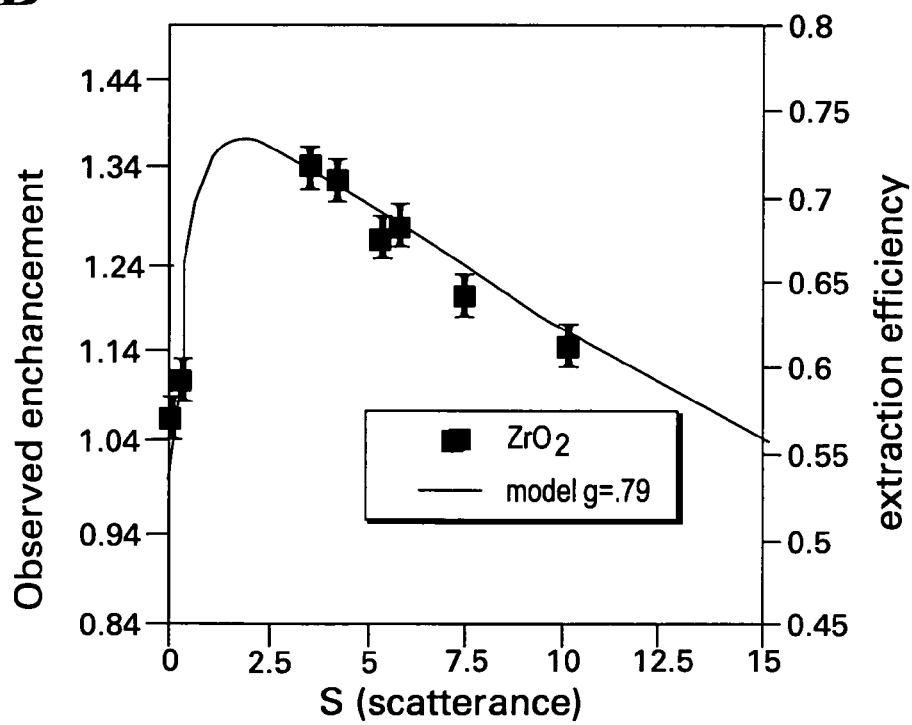

In the top panel of FIG. 12 we show the changes in the spectra as a function of angle. Our results are similar to those obtained by others using similar apparatus and are indicative of microcavity effects on the spectra. In the range between 0 deg and 50 the changes in the spectra are relatively small, as the angle is increased further a small shift of the spectrum towards bluer wavelengths is observed.

We find that the spectrum of the OLED changes slightly depending upon the degree of light scattering, (FIG. 12 bottom) in a manner consistent with our observations of the microcavity effects seen the in the angularly resolved spectra. The spectra have been scaled by a factor, $1/\epsilon$, so that the integrated areas are the same. This spectral shift, while small, is sufficient to skew the determination of the relative light output through use of a candela meter or luminous flux measurement by about 8%.

Two-Parameter Henyey-Greenstein Model

In the comparison between the angularly resolved scattering data and the results of the one parameter Henyey-Greenstein model, there is a discrepancy at low angles between the model and the experimental data. (FIG. 8) We can improve our fit by introducing the a two-term H-G phase function:

$$p_{2HG}(\theta, \theta') = \frac{1-g^2}{(1+g^2-2g\cos(\theta-\theta'))^{3/2}} f + (1-f)\frac{1-g_2^2}{(1+g_2^2-2g_2\cos(\theta-\theta'))^{3/2}} \quad (B1)$$

Figure 13A:
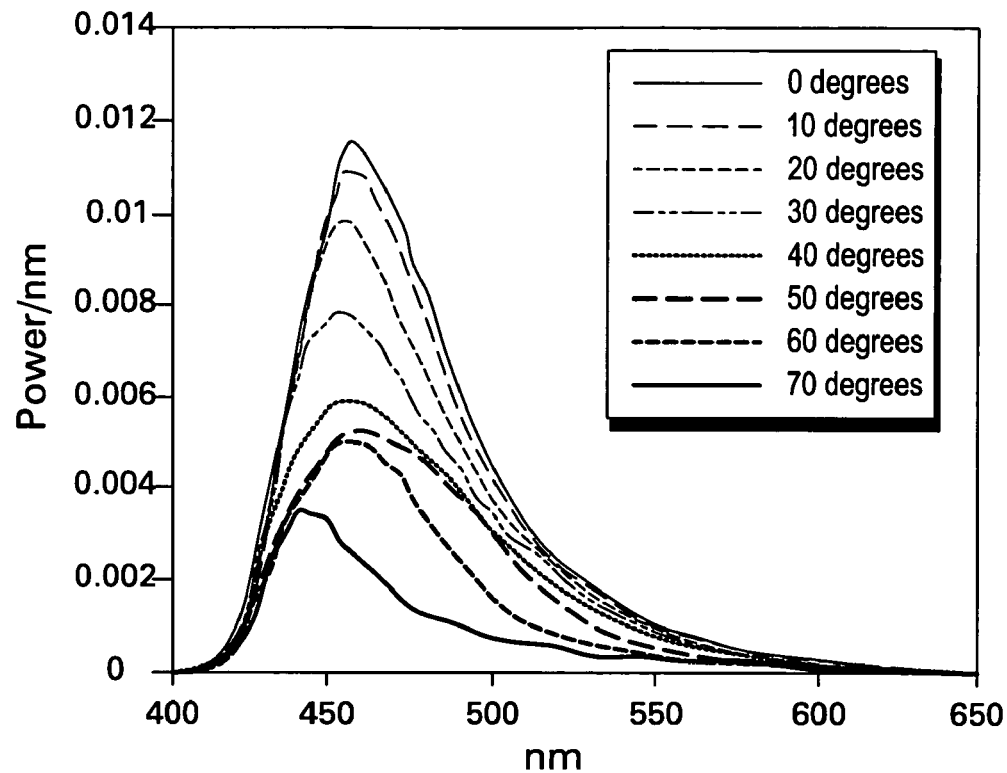
FIG. 13: Top: The emission spectrum of a typical OLED a used in this study at different emission angles measured using the CCD-glass hemisphere apparatus described in the text. Bottom: The OLED spectrum was measured optically coupled to a scattering tape (dotted line) and with the bare substrate (solid line).
Figure 13B:
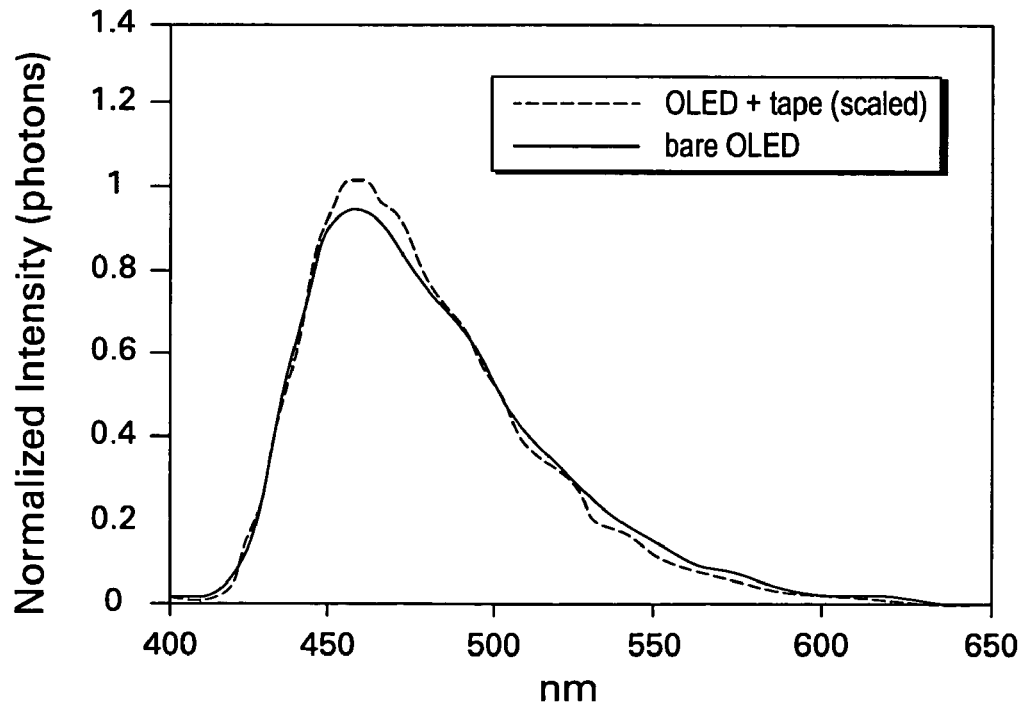

In FIG. 13 we plot the data versus the predictions of the model using the 2 term function where g=0.77, f=0.5 and $g_2$=0.97. However, we find that while this leads of a somewhat better fit to the observed angular dependence, there is very little difference in the calculated total transmission and reflection; thus the additional complexity entailed by the introduction of two more fitting parameters is not justified. Accordingly, we use the one term Henyey-Greenstein function to analyze our experiments.

Table I: Experimental and scatterance, total transmission and total reflectance data for 5 different particle loadings in PDMS. Data was collected at 488 nm. The value of g needed to best match the data using the radiative transfer model is shown in the last column, along with the calculated values of total transmittance and reflectance.

| Scatterer | S | T (expt) | R (expt) | T (model) | R (model) | g (model) |
|---|---|---|---|---|---|---|
| $ZrO_2$ | 1.91 | 0.770 | 0.231 | 0.77 | 0.23 | 0.79 |
| $ZrO_2$ | 3.38 | 0.684 | 0.314 | 0.684 | 0.315 | 0.798 |
| $ZrO_2$ | 5.62 | 0.581 | 0.426 | 0.578 | 0.42 | 0.777 |
| 'cool white' | 3.77 | 0.736 | 0.254 | 0.742 | 0.256 | 0.877 |
| 'cool white' | 6.90 | 0.631 | 0.364 | 0.633 | 0.366 | 0.872 |

Figure 14:
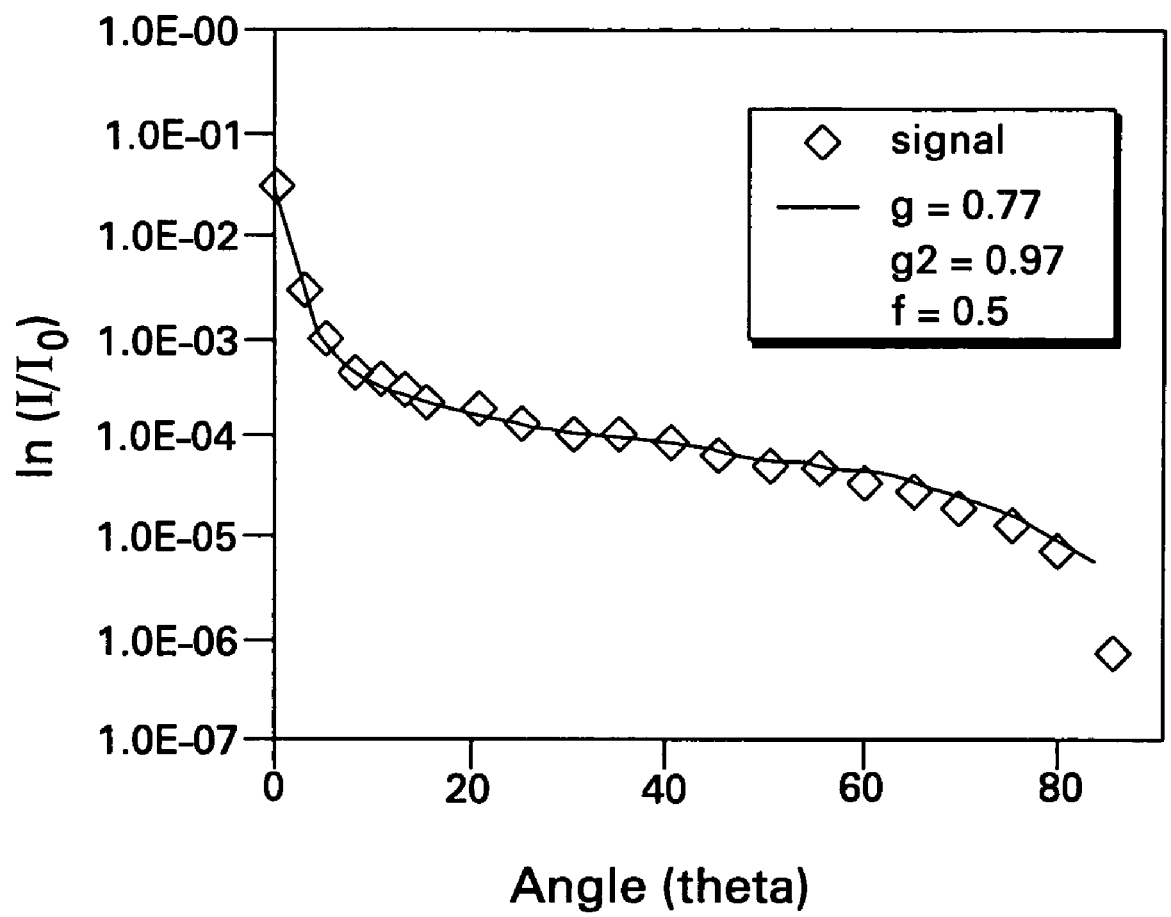
FIG. 14: Measured angular dependence of light scattering of a collimated 670 nm beam incident on a PDMS tape loaded with 'cool white' phosphor particles (open circles). The solid line is the model predictions but using a two term H-G model for the phase function. (Equation 37). The phase function input parameters are given in the legend.
Figure 19:
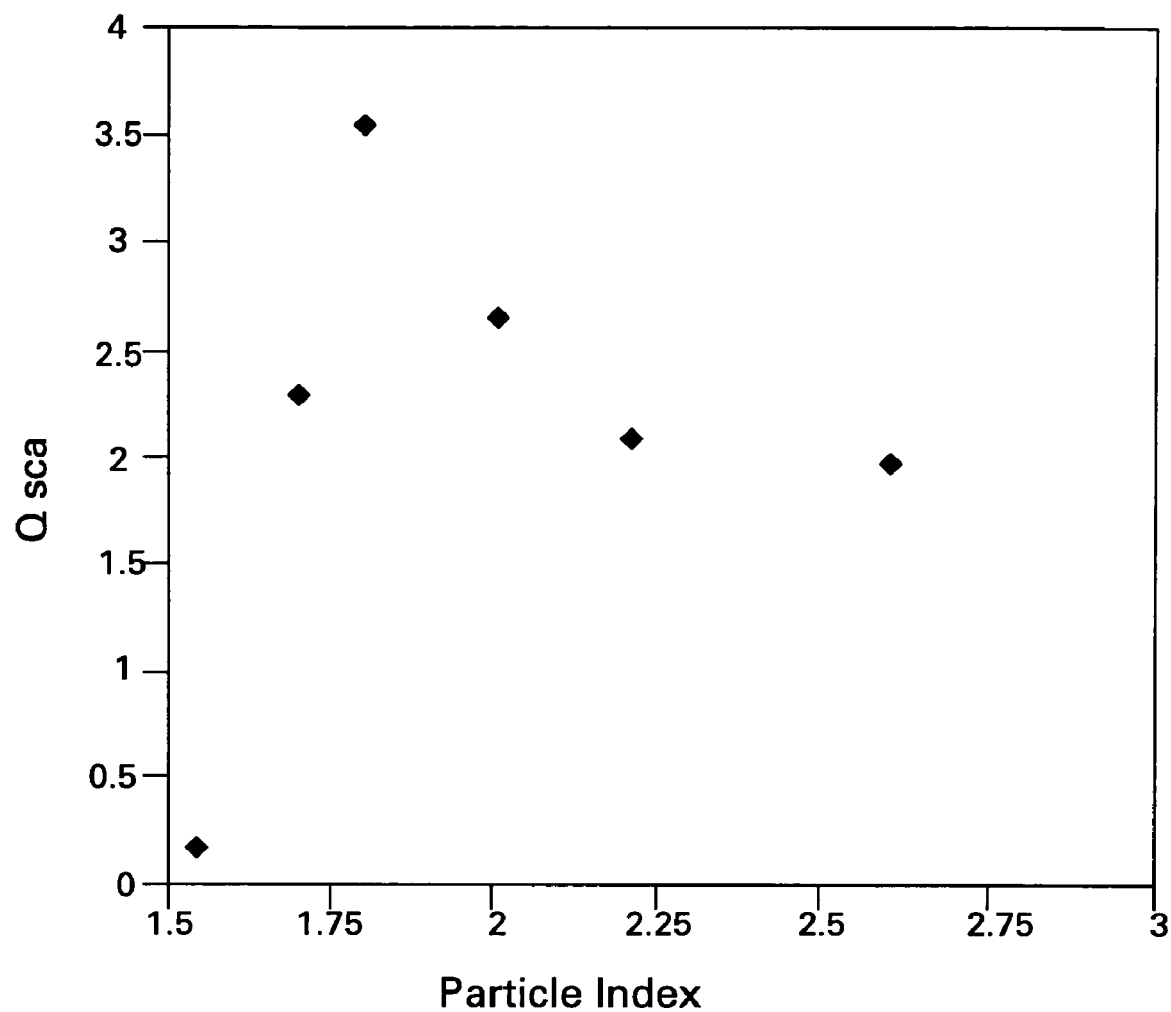
FIG. 19: Variation of per particle scattering efficiency as a function of particle index. The index of surrounding medium is 1.5 and incident light wavelength was set at 0.52 microns, the particle radius is 0.5 microns.

C. Rules for Particle Size and Size Distribution for Optimal Use of Light Scattering to Result in Optimal Light Extraction 1. Relationship Between Particle Morphology and Scattering Events The propagation characteristics of light in a scattering medium are affected by two factors. These factors are the density of the scattering centers and the angular deviation caused by each scattering event. The average density of particles is controlled by the particle volume loading in the medium and can be determined by knowing the inline transmission, i.e. the fraction of a columnated beam that traverses the medium without being scattered and particle radius. The angular deviation induced by each scattering event, is determined by the scattering particle's size, shape, and index of refraction, and the wavelength of the incoming light, the quantity is known and is the phase function. For spherical particles, the phase function may be computed analytically via the Mie theory. FIG. 14 presents some sample Mie theory calculations that illustrate the effect of changing the size upon the phase function. For these calculations the particle index was set to 1.8 the medium index was set to 1.5 and the wavelength of light was set to 520 nm. The particle radius for each curve is indicated in the legend. For purposes of comparison the phase function were all normalized to have a maximum value of 1

The above figure demonstrates that the average deviation is a strong function of the particle radius. We now need to calculate the effect of multiple light scattering from an ensemble of scattering centers (each having a well defined phase function). This calculation is detailed in Section A above. In that Section we find that use of the exact results from Mie theory is somewhat cumbersome, so we use a simpler description of the phase function introduced by Henyey-Greenstein:

$$p_{1HG}(\theta, \theta') = \frac{1-g^2}{(1+g^2-2g\cos(\theta-\theta'))^{3/2}} \quad (42)$$

where θ,θ' are the input and output angles. Thus the phase function is reduced to a function of the "asymmetry parameter", g, which is the expectation value of the angle of deviation from normal incidence. A value of g=1 implies that the scattering particles do not deviate the beam at all, a value of g=0 implies isotropic scattering events (light is redirected equally in the forward and reverse directions), and a value of g=−1 implies that incoming light is reflected directly backwards. In the figure below, the Henyey-Greenstein phase function for different values of g is plotted. The values of g are shown in the legend. These values were chosen so that the curves roughly corresponded the Mie model calculation above.

FIG. 16 is an example how the asymmetry parameter, g, varies as a function of particle size over a range of typical particle sizes. The conclusion from combining the information in the Figures is that g increases as the particle size is increased.

There are other factors that influence the effective value of g, but these tend to be have much less effect that the gross particle size. In the figure below, the phase function for 0.5 micron diameter particles is plotted for different values of the particle optical index. The other physical parameters are kept at the same values as the previous calculations.

Here the variation between the different phase functions is more subtle, and is primarily evidenced by the amount of light that is backscattered (the region near 180 degrees) and by the amount of light that is scattered outside the central peak. Variations in particle shape and morphology also lead to changes in the observed phase function, and this has been a subject of considerable scrutiny. For non-absorbing (i.e. real index of refraction) particles, deviations from spherical shapes also tend to affect the weighting of the primary forward peak and the backscattering peak in a manner that is small relative to the effect of size.

Finally, the probability that any given particle will scatter light of a given is determined by the particle radius and its optical index of refraction. A measure of this probability is the particle cross-section, C, which can decomposed into the product of the geometrical cross-section ($\pi r^2$) and a part that contains the detailed wave-physics of scattering $Q_{sca}$.

$$C_{sca} = \pi r^2 Q_{sca} \quad (43)$$

$C_{sca}$ depends upon the ratio of the optical index of the particle to the surrounding medium, the size of the particle and the wavelength of the incident light. FIG. 18 shows how $Q_{sca}$ varies for a single particle size (r=0.5 microns) embedded in a medium of index n=1.5. As one varies the index one can tune the per-particle scattering efficiency, thus making the total scattering from an ensemble of particles uncoupled from the loading of the particles in the medium.

2. Impact of the Value of g on Total Light Output from OLED Devices

In Section A above, the relationship between g and output coupling efficacy in an OLED device is explored in detail for ensembles of randomly ordered particles. In particular, the relationship between g and S to give was explored in order to optimize light extraction for large planer surfaces such as OLEDs. We find that optimal value of S (the scatterance) depends upon the value of g, as shown in FIG. 16. It clearly indicates that at higher values of g (~0.9), the optimal scatterance is also high (~3), whereas for lower values of g (<0.3) the optimal value of the scatterance is lower. In addition, as the value of g is increased, the peak light output (as a function of scatterance) is also increased and the overall region over which scatterance may be varied to achieve near optimal performance is increased.

3. Design Rules

The analysis above indicated that higher values of g for the particle ensemble are generally preferred over lower values. Use of particle ensembles that exhibit higher values of g (>0.8) provides not only a higher maximum light output from the device but also a larger range of total scatterance. Only in cases where the scatterance must be kept low due to some other design considerations are lower values of g desireable. In all cases the particles should be chosen so as to minimize the amount of backscattered light.

Given the desirablity of high values of g, this in turn dictates the particle size and shape and index. For spherical or nearly spherical particles, obtaining larger values of g requires the use of larger particles (above 0.5 microns in radius) and the exclusion of fine particles from the system. This implies that particle size distributions need not be symmetric but rather weighted toward larger sizes.

The case of weakly absorbent luminescing particles imposes additional constraints. Here it is often the case that one wishes to absorb a certain fraction of the incident light and this sets the desired particle loading. Thus, in this case one would choose the size and, if possible) the optical index of the luminescent particle so as to operate at the optimal value of g.

There is also literature evidence that at very high particle packing densities, the scattering events non-longer are independent. Thus, higher volume loading fractions (>0.3) have the effect of increasing the effective value of g.

There is also an upper limit on the particle size at which there is only an incremental increase in the value of g despite a significant change in the particle radius. For most systems this is reached by 10 microns in radius and thus having particle that are larger than 10 microns radius is less desirable.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A light source comprising:
   a light-emitting device; and
   a light-scattering medium optically coupled to the light-emitting device,
   wherein the light scattering medium has a light scattering anisotropy g in a range from about 0 to about 0.99, and a scatterance S is selected from the group consisting of $0<S\leq 0.22$ and $S\geq 3$; and
   the scatterance and light emitted by the light source possess azimuthal symmetry.

2. A light source comprising:
   a light-emitting device; and
   a light-scattering medium optically coupled to the light-emitting device, wherein the light scattering medium has a light scattering anisotropy g in a range from about 0.8 to about 0.95, and a scatterance S greater than about 3; and
   the scatterance and light emitted by the light source possess azimuthal symmetry.

3. The light source of claim 2, wherein the light-emitting device is an organic electroluminescent device.

4. The light source of claim 1, wherein the light-emitting device is an organic electroluminescent device.

5. The light source of claim 3, wherein the light-emitting device comprises an organic electroluminescent material disposed between two electrodes.

6. The light source of claim 3, wherein the light-scattering medium comprises light-scattering particles dispersed in a matrix.

7. The light source of claim 6, wherein the light scattering particles have a median particle size $d_{50}$ of about 6 micrometers.

8. The light source of claim 6, wherein the light-scattering medium is a layer having a thickness from about 400 micrometers to about 600 micrometers.

* * * * *